US012810793B2

(12) United States Patent
Xu

(10) Patent No.: US 12,810,793 B2
(45) Date of Patent: Nov. 24, 2026

(54) SHIFT REGISTER AND DRIVING METHOD THEREOF, DRIVING CIRCUIT, DISPLAY SUBSTRATE AND DEVICE

(71) Applicants: Chengdu BOE Optoelectronics Technology Co., Ltd., Chengdu (CN); BOE TECHNOLOGY GROUP CO., LTD., Beijing (CN)

(72) Inventor: Yingsong Xu, Beijing (CN)

(73) Assignees: Chengdu BOE Optoelectronics Technology Co., Ltd., Chengdu (CN); Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 19/306,958

(22) Filed: Aug. 21, 2025

(65) Prior Publication Data

US 2025/0372032 A1 Dec. 4, 2025

Related U.S. Application Data

(60) Division of application No. 18/455,711, filed on Aug. 25, 2023, now Pat. No. 12,424,162, which is a continuation of application No. 17/788,825, filed as application No. PCT/CN2021/112398 on Aug. 13, 2021, now Pat. No. 11,776,470.

(30) Foreign Application Priority Data

Sep. 25, 2020 (CN) ......................... 202011028890.9
Dec. 10, 2020 (CN) ......................... 202011452344.8

(51) Int. Cl.
*G09G 3/3225* (2016.01)
*G11C 19/28* (2006.01)

(52) U.S. Cl.
CPC ........... *G09G 3/3225* (2013.01); *G11C 19/28* (2013.01); *G09G 2300/0852* (2013.01); *G09G 2310/0286* (2013.01)

(58) Field of Classification Search
CPC ......... G09G 3/3225; G09G 2300/0852; G09G 2310/0286; G11C 19/28
USPC .......................................................... 345/204
See application file for complete search history.

(56) References Cited

U.S. PATENT DOCUMENTS

| | | | | |
|---|---|---|---|---|
| 10,026,362 | B2 * | 7/2018 | Li | G09G 3/3266 |
| 11,170,681 | B2 * | 11/2021 | Li | G11C 19/28 |
| 11,605,349 | B2 * | 3/2023 | Tang | G09G 3/3233 |
| 11,886,658 | B2 * | 1/2024 | Jung | G06F 3/0412 |

* cited by examiner

*Primary Examiner* — Calvin C Ma
(74) *Attorney, Agent, or Firm* — HOUTTEMAN LAW LLC

(57) ABSTRACT

The present invention provides a shift register unit, a driving method, a driving circuit and a driving device. The shift register unit includes a first input circuit, a second input circuit, a control circuit and an output circuit; the first input circuit provides an input signal to a first node and provides a second voltage signal to a third node under control of a second clock signal; the second input circuit outputs a first voltage signal to the third node and controls a potential at a fourth node under control of a potential at the first node and an input control signal; the control circuit provides a first voltage signal to the first node under control of a potential at a fourth node. The present invention provides waveforms for operation of specific pixels.

10 Claims, 17 Drawing Sheets

SHIFT REGISTER AND DRIVING METHOD THEREOF, DRIVING CIRCUIT, DISPLAY SUBSTRATE AND DEVICE

TECHNICAL FIELD

The present disclosure relates to the field of display technology, in particular to a shift register and a driving method thereof, a driving circuit, a display substrate and a display device.

BACKGROUND

In recent years, due to the excellent display effect of an active-matrix organic light-emitting diode (AMOLED) display, the AMOLED industry is rapidly developing at home and abroad, and various pixel circuits are developed successively. In order to improve the competitiveness of the screen and reduce the bezel size and price of the screen, it is proposed to use array technology to prepare a shift register, instead of a gate driving integrated circuit (Gate IC), inside the bezel, which has both price advantage and bezel advantage and can provide a variety of waveforms according to input signals provided by the integrated circuit (IC). The design of Gate Driver On Array (GOA) has been widely applied to display devices, but GOA needs to take the reliability problem into special consideration, so the design with more thin film transistors (TFTs) and more capacitors based on the early 4T1C structure is proposed, and the main design direction is developed from the earliest function realization to high credibility and high reliability.

SUMMARY

In order to reduce the design cost of the Gate IC and achieve narrow bezel design, embodiments of the present disclosure provide a shift register unit that may be fabricated by using back plane (BP) array process to provide a waveform for operation of a specific pixel.

In order to solve the above technical problem, embodiments of the present disclosure provide a shift register unit, including a first input circuit, a second input circuit, a control circuit and an output circuit, wherein the first input circuit is respectively coupled to an input terminal, a second voltage terminal, a second clock signal terminal, a first node and a third node, and is configured to provide an input signal to the first node and provide a second voltage signal to the third node in response to a second clock signal provided by the second clock signal terminal; the input terminal is configured to provide the input signal, and the second voltage terminal is configured to provide the second voltage signal; the second input circuit is respectively coupled to an input control terminal, the first node, the third node, a fourth node and a first voltage terminal, and is configured to output a first voltage signal to the third node and control a potential at the fourth node in response to a potential at the first node and an input control signal provided by the input control terminal; the input control terminal is a first clock signal terminal or a third clock signal terminal, and the input control signal is a first clock signal provided by the first clock signal terminal or a clock signal provided by the third clock signal terminal; the control circuit is respectively coupled to the first node, the fourth node and the first voltage terminal and is configured to provide the first voltage signal to the first node in response to the potential at the fourth node; the first voltage terminal is configured to provide the first voltage signal; and the output circuit is electrically coupled to the third node, the first node, the first voltage terminal, the first clock signal terminal and an output terminal, respectively, and is configured to control a signal output by the output terminal according to a potential at the third node, a potential at the first node, the first voltage signal and the first clock signal.

In an embodiment, the second input circuit includes a first transistor, a second transistor, and a first capacitor, and the input control terminal is the first clock signal terminal; a control electrode of the first transistor is electrically coupled to the first clock signal terminal, a first electrode of the first transistor is electrically coupled to the fourth node, and a second electrode of the first transistor is electrically coupled to the third node; a control electrode of the second transistor is electrically coupled to the first node, a second electrode of the second transistor is electrically coupled to the fourth node, and a first electrode of the second transistor is electrically coupled to the first voltage terminal; and a first terminal of the first capacitor is electrically coupled to the first clock signal terminal, and a second terminal of the first capacitor is electrically coupled to the fourth node.

In an embodiment, the second input circuit includes a first transistor, a second transistor, and a first capacitor, and the input control terminal is the third clock signal terminal; a control electrode of the first transistor is electrically coupled to the third clock signal terminal, a first electrode of the first transistor is electrically coupled to the fourth node, and a second electrode of the first transistor is electrically coupled to the third node; a control electrode of the second transistor is electrically coupled to the first node, a second electrode of the second transistor is electrically coupled to the fourth node, and a first electrode of the second transistor is electrically coupled to the first voltage terminal; and a first terminal of the first capacitor is electrically coupled to the third clock signal terminal, and a second terminal of the first capacitor is electrically coupled to the fourth node.

In an embodiment, the second input circuit includes a first transistor, a second transistor, and a first capacitor; a control electrode of the first transistor is electrically coupled to the input control terminal, a first electrode of the first transistor is electrically coupled to the fourth node, and a second electrode of the first transistor is electrically coupled to the third node; a control electrode of the second transistor is electrically coupled to the first node, a second electrode of the second transistor is electrically coupled to the fourth node, and a first electrode of the second transistor is electrically coupled to the first voltage terminal; and a first terminal of the first capacitor is electrically coupled to a direct-current voltage terminal or the input terminal, and a second terminal of the first capacitor is electrically coupled to the fourth node.

In an embodiment, the control circuit includes a seventh transistor; and a control electrode of the seventh transistor is electrically coupled to the fourth node, a first electrode of the seventh transistor is electrically coupled to the first voltage terminal, and a second electrode of the seventh transistor is coupled to the first node.

In an embodiment, the control circuit further includes a fourth capacitor, a first terminal of the fourth capacitor is electrically coupled to the first voltage terminal, and a second terminal of the fourth capacitor is electrically coupled to the first node.

In an embodiment, the first input circuit includes a third transistor and a fourth transistor, a control electrode of the third transistor is electrically coupled to the second clock signal terminal, a first electrode of the third transistor is electrically coupled to the second voltage terminal, and a second electrode of the third transistor is electrically coupled to the third node; and a control electrode of the fourth transistor is electrically coupled to the second clock signal terminal, a second electrode of the fourth transistor is electrically coupled to the first node, and a first electrode of the fourth transistor is electrically coupled to the input terminal.

In an embodiment, the output circuit includes a voltage stabilizing sub-circuit and an output sub-circuit, the voltage stabilizing sub-circuit is electrically coupled to the third node, the output terminal, and the first node, respectively, and is configured to maintain the potential at the third node and control the potential at the first node according to the signal output by the output terminal, and the output sub-circuit is electrically coupled to the third node, the first node, the first voltage terminal, the first clock signal terminal and the output terminal, respectively, and is configured to control provision of the first voltage signal to the output terminal under control of the potential at the third node, and control provision of the first clock signal to the output terminal under control of the potential at the first node.

In an embodiment, the voltage stabilizing sub-circuit includes a second capacitor and a third capacitor, a first terminal of the second capacitor is coupled to the first node, and a second terminal of the second capacitor is coupled to the output terminal, a first terminal of the third capacitor is coupled to the third node, and a second terminal of the third capacitor is coupled to the first voltage terminal, the output sub-circuit includes a fifth transistor and a sixth transistor, a control electrode of the fifth transistor is electrically coupled to the third node, a first electrode of the fifth transistor is electrically coupled to the first voltage terminal, and a second electrode of the fifth transistor is electrically coupled to the output terminal, and a control electrode of the sixth transistor is electrically coupled to the first node, a first electrode of the sixth transistor is electrically coupled to the first clock signal terminal, and a second electrode of the sixth transistor is electrically coupled to the output terminal.

In an embodiment, the output circuit includes a voltage stabilizing sub-circuit and an output sub-circuit, the voltage stabilizing sub-circuit is electrically coupled to the third node, the output terminal, the first node, the second node, and a control voltage terminal, respectively, and is configured to maintain the potential at the third node, control connection or disconnection between the first node and the second node in response to a control voltage signal provided by the control voltage terminal, and control a potential at the second node according to the signal output by the output terminal, and the output sub-circuit is electrically coupled to the third node, the second node, the first voltage terminal, the first clock signal terminal, and the output terminal, respectively, and is configured to control provision of the first voltage signal to the output terminal under control of the potential at the third node, and control provision of the first clock signal to the output terminal under control of the potential at the second node.

In an embodiment, the voltage stabilizing sub-circuit includes an eighth transistor, a second capacitor, and a third capacitor, a control electrode of the eighth transistor is electrically coupled to the control voltage terminal, a first electrode of the eighth transistor is electrically coupled to the first node, and a second electrode of the eighth transistor is electrically coupled to the second node, a first terminal of the second capacitor is coupled to the second node, and a second terminal of the second capacitor is coupled to the output terminal, a first terminal of the third capacitor is coupled to the third node, and a second terminal of the third capacitor is coupled to the first voltage terminal, the output sub-circuit includes a fifth transistor and a sixth transistor, a control electrode of the fifth transistor is electrically coupled to the third node, a first electrode of the fifth transistor is electrically coupled to the first voltage terminal, and a second electrode of the fifth transistor is electrically coupled to the output terminal, a control electrode of the sixth transistor is electrically coupled to the second node, a first electrode of the sixth transistor is electrically coupled to the first clock signal terminal, and a second electrode of the sixth transistor is electrically coupled to the output terminal, and the control voltage terminal is the second voltage terminal or the second clock signal terminal.

In an embodiment, the eighth transistor is a double-gate transistor.

In an embodiment, the output sub-circuit further includes a fifth capacitor, and a first terminal of the fifth capacitor is electrically coupled to the second node, and a second terminal of the fifth capacitor is electrically coupled to a direct current voltage terminal.

The present disclosure further provides a driving circuit, including a plurality of shift register units coupled in cascade, an input terminal of a first-stage shift register unit is coupled to a start signal terminal, an input terminal of a (i+1)th-stage shift register unit is coupled to an output terminal of an ith-stage shift register unit, an odd-numbered stage of shift register unit has a first clock signal terminal coupled to a first clock signal line and a second clock signal terminal coupled to a second clock signal line, and an even-numbered stage of shift register unit has a first clock signal terminal coupled to the second clock signal line and a second clock signal terminal coupled to the first clock signal line, where i+1 is a positive integer greater than or equal to 2.

In an embodiment, a third clock signal terminal of the odd-numbered stage of shift register unit is coupled to a fourth clock signal line, and a third clock signal terminal of the even-numbered stage of shift register unit is coupled to a third clock signal line.

In an embodiment, a difference between a phase of a clock signal provided by the first clock signal line and a phase of a clock signal provided by the second clock signal line is 90 degrees; and a clock signal provided by the third clock signal line is reversed with respect to the clock signal provided by the first clock signal line, and a clock signal provided by the fourth clock signal line is reversed with respect to the clock signal provided by the second clock signal line.

The present disclosure further provides a method for driving a shift register unit, which is applied to the shift register unit described above, wherein the method includes: in a first phase, providing, by the first input circuit and in response to the second clock signal, the input signal to the first node and the second voltage signal to the third node, and providing, by the output circuit and under control of the potential at the third node, the first voltage signal to the output terminal; in a second phase, maintaining, by the output circuit, the potential at the third node; controlling, by the second input circuit and in response to the input control signal, connection between the fourth node and the third node, so that the potential at the fourth node is the second voltage signal, and providing, by the control circuit and under control of the potential at the fourth node, the first voltage signal to the first node; and providing, by the output circuit and under control of the potential at the third node, the first voltage signal to the output terminal; in a third phase, providing, by the first input circuit and in response to the second clock signal, the input signal to the first node, providing, by the first input circuit and in response to the second clock signal, the second voltage signal to the third node, providing, by the output circuit and under control of the potential at the third node, the first voltage signal to the output terminal, and providing, by the output circuit and under control of the potential at the first node, the first clock signal to the output terminal; in a fourth phase, writing, by the second input circuit and under control of the potential at the first node and the input control signal, the first voltage signal into the third node, the potential at the first node being the second voltage signal, and providing, by the output circuit, the first clock signal to the output terminal; in a fifth phase, writing, by the second input circuit and under control of the potential at the first node and the input control signal, the first voltage signal into the third node, the potential at the first node being the second voltage signal, and providing, by the output circuit, the first clock signal to the output terminal; and in a sixth phase, providing, by the first input circuit and in response to the second clock signal, the input signal to the first node, and providing, by the first input circuit and in response to the second clock signal, the second voltage signal to the third node; and providing, by the output circuit and under control of the potential at the third node, the first voltage signal to the output terminal.

The present disclosure further provides a display device including the driving circuit described above.

Additional features and advantages of the present disclosure will be set forth in the description which follows, and in part will be apparent from the description, or may be learned by implementing the present disclosure. The objectives and other advantages of the present disclosure may be realized and attained by the structure particularly pointed out in the written description and drawings.

BRIEF DESCRIPTION OF DRAWINGS

The accompanying drawings, which constitute a part of the specification, are to provide an understanding of the technical solutions of the present disclosure, to explain the technical solutions of the present disclosure together with the embodiments of the present disclosure, but not to limit the technical solutions of the present disclosure.

DETAIL DESCRIPTION OF EMBODIMENTS

Figure 1:
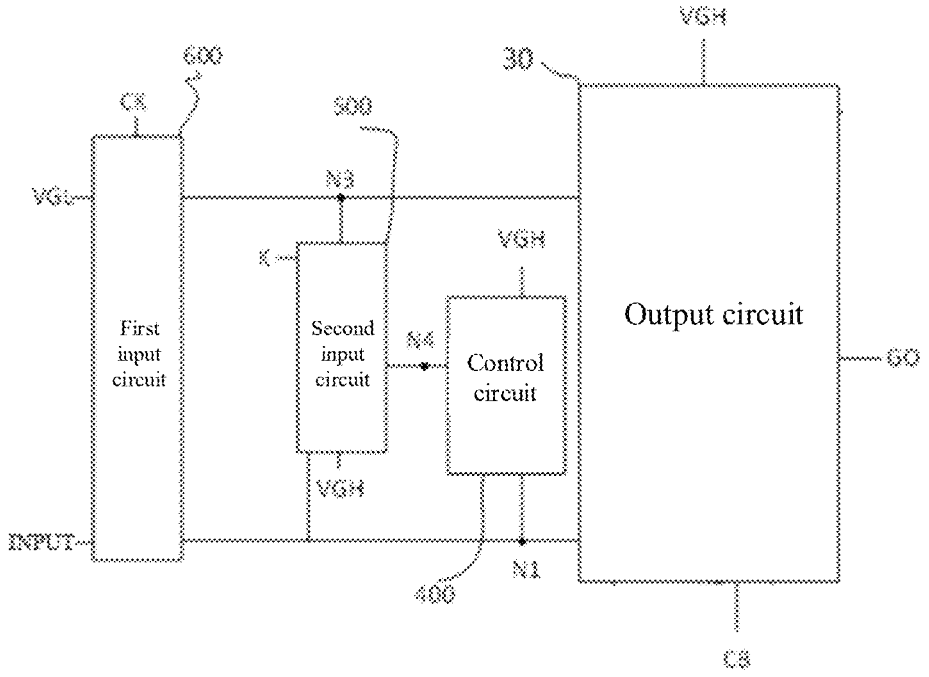
FIG. 1 is a schematic diagram of a shift register unit according to an exemplary embodiment of the present disclosure.

The present application herein describes a plurality of embodiments, but the description is exemplary rather than restrictive and it will be apparent to those of ordinary skill in the art that many more embodiments and implementations are within the scope of the embodiments described herein. Although many possible combinations of features are shown in the drawings and discussed in the detailed description, many other combinations of the disclosed features are possible. Any feature or element of any embodiment may be used in combination with, or instead of, any other feature or element in any other embodiments, unless expressly limited otherwise.

The present application includes and contemplates combinations of features and elements known to those of ordinary skill in the art. The embodiments, features and elements disclosed herein may also be combined with any conventional features or elements to form a specific inventive solution as limited by a claim. Any feature or element of any embodiment may also be combined with features or elements from another inventive solution to form another specific inventive solution as limited by another claim. Thus, it should be understood that any of the features shown and/or discussed in the present application may be implemented individually or in any suitable combination. Accordingly, the embodiments are not to be limited except in light of the attached claims and their equivalents. Further, various modifications and changes may be made within the scope of the appended claims.

Further, in describing representative embodiments, the specification may have presented the method and/or process as a particular sequence of steps. However, to the extent that the method or process does not rely on the particular order of steps set forth herein, the method or process should not be limited to the particular sequence of steps described. Other sequences of steps are possible as will be appreciated by those of ordinary skill in the art. Therefore, the particular sequence of the steps set forth in the specification should not be construed as limitation on the claims. Furthermore, the claims directed to the method and/or process should not be limited to the performance of their steps in the order as listed, and one skilled in the art can readily appreciate that the sequences may be varied and still remain within the spirit and scope of the embodiments of the present application.

Unless otherwise defined, technical or scientific terms used in the embodiments of the present disclosure should have the ordinary meaning as understood by one of ordinary skill in the art to which the present disclosure belongs. The ordinal numbers such as "first", "second", "third", etc., used in the embodiments of the present disclosure do not denote any order, quantity, or importance, but rather are provided to avoid confusion among the constituent elements, and are not limited in number. In addition, the words similar to these ordinal numbers do not denote any order, quantity, or importance, but rather are used to distinguish one element from another. The word "comprise", "include", and the like, means that the element or item preceding the word includes the element or item listed after the word and its equivalent, but does not exclude other elements or items. The terms "connected", "coupled" and the like are not limited to physical or mechanical connections, but may include electrical connections, whether direct or indirect.

It will be appreciated by those skilled in the art that the transistors used in all embodiments of the present disclosure may be thin film transistors or field effect transistors or other devices having the same characteristics. The thin film transistor may be an oxide semiconductor thin film transistor, a low temperature polycrystalline silicon thin film transistor, an amorphous silicon thin film transistor, or a microcrystalline silicon thin film transistor. The thin film transistor may be specifically a thin film transistor having a bottom gate structure or a thin film transistor having a top gate structure as long as a switching function can be achieved. Since the source electrode and the drain electrode of the transistor used herein are symmetrical, the source electrode and the drain electrode may be interchanged. In the embodiments of the present application, a gate electrode of a transistor is referred to as a control electrode. In order to distinguish two electrodes of the transistor except the gate electrode, one of the two electrodes is referred to as a first electrode, and the other is referred to as a second electrode, the first electrode may be a source electrode or a drain electrode, and the second electrode may be a drain electrode or a source electrode.

An embodiment of the present disclosure provides a shift register unit. The shift register unit includes a first input circuit, a second input circuit, a control circuit and an output circuit.

The first input circuit is respectively coupled to an input terminal, a second voltage terminal, a second clock signal terminal, a first node and a third node, and is configured to provide an input signal to the first node and provide a second voltage signal to the third node under control of a second clock signal provided by the second clock signal terminal. The input terminal is configured to provide the input signal, and the second voltage terminal is configured to provide the second voltage signal.

The second input circuit is respectively coupled to an input control terminal, the first node, the third node, a fourth node and a first voltage terminal, and is configured to output a first voltage signal to the third node and control a potential at the fourth node under control of a potential at the first node and an input control signal provided by the input control terminal. The input control terminal is a first clock signal terminal or a third clock signal terminal, and the input control signal is a first clock signal provided by the first clock signal terminal or a clock signal provided by the third clock signal terminal; and the first voltage terminal is configured to provide the first voltage signal.

The control circuit is respectively coupled to the first node, the fourth node and the first voltage terminal and is configured to provide the first voltage signal to the first node according to a signal at the fourth node.

The output circuit is electrically coupled to the third node, the first node, the first voltage terminal, a first clock signal terminal and an output terminal, respectively, and is configured to control a signal output by the output terminal according to a potential at the third node, a potential at the first node, the first voltage signal and the first clock signal.

In an embodiment of the present disclosure, the first voltage terminal may be a high voltage terminal, and the second voltage terminal may be a low voltage terminal, but they are not limited thereto.

The technical solution of the present disclosure is described in detail below with reference to the accompanying drawings.

FIG. 1 is a schematic diagram of a shift register unit according to an exemplary embodiment of the present disclosure. In an exemplary embodiment, as shown in FIG. 1, the shift register unit may include a first input circuit 600, a second input circuit 500, a control circuit 400, and an output circuit 30.

The first input circuit 600 is respectively coupled to an input terminal INPUT, a second voltage terminal VGL, a second clock signal terminal CK, a first node N1, and a third node N3, the first input circuit 600 is configured to provide an input signal to the first node N1 and a second voltage signal to the third node N3 under control of a second clock signal provided by the second clock signal terminal CK, the input terminal INPUT is configured to provide the input signal, and the second voltage terminal VGL is configured to provide the second voltage signal.

The second input circuit 500 is respectively coupled to an input control terminal K, the first node N1, the third node N3, a fourth node N4 and a first voltage terminal VGH, and configured to output a first voltage signal to the third node N3 and control a potential at the fourth node N4 under control of a potential at the first node N1 and an input control signal provided by the input control terminal K, and the first voltage terminal VGH is configured to provide the first voltage signal.

The control circuit 400 is respectively coupled to the first node N1, the fourth node N4 and the first voltage terminal VGH, and is configured to provide the first voltage signal to the first node N1 under control of a potential at the fourth node N4.

The output circuit 30 is electrically coupled to the third node N3, the first node N1, the first voltage terminal VGH, a first clock signal terminal CB, and an output terminal GO, respectively, and is configured to control a signal output by the output terminal GO according to a potential at the third node N3, a potential at the first node N1, the first voltage signal, and a first clock signal, and the first clock signal terminal CB is configured to provide the first clock signal.

In an embodiment of the present disclosure, the input control terminal may be the first clock signal terminal or a third clock signal terminal, and the input control signal may be the first clock signal provided by the first clock signal terminal or a clock signal provided by the third clock signal terminal, but is not limited thereto.

The transistor in the application document may be a P-type transistor, which is in an on state when a control terminal thereof receives a low voltage signal, and is in an off state when the control terminal thereof receives a high voltage signal, but is not limited thereto.

In an embodiment, the second input circuit may include a first transistor, a second transistor, and a first capacitor, and the input control terminal is the first clock signal terminal.

A control electrode of the first transistor is electrically coupled to the first clock signal terminal, a first electrode of the first transistor is electrically coupled to the fourth node, and a second electrode of the first transistor is electrically coupled to the third node.

A control electrode of the second transistor is electrically coupled to the first node, a second electrode of the second transistor is electrically coupled to the fourth node, and a first electrode of the second transistor is electrically coupled to the first voltage terminal.

A first terminal of the first capacitor is electrically coupled to the first clock signal terminal, and a second terminal of the first capacitor is electrically coupled to the fourth node.

In a specific implementation, the second input circuit may include a first transistor controlled by the first clock signal, a second transistor controlled by the potential at the first node, and a first capacitor controlling a potential at the fourth node according to the first clock signal, the first transistor controls connection or disconnection between the fourth node and the third node under control of the first clock signal; the second transistor controls connection or disconnection between the fourth node and the first voltage terminal under control of the potential of the first node; and the first capacitor controls the potential at the fourth node according to the first clock signal.

In an embodiment, the second input circuit includes a first transistor, a second transistor, and a first capacitor, and the input control terminal is the third clock signal terminal.

A control electrode of the first transistor is electrically coupled to the third clock signal terminal, a first electrode of the first transistor is electrically coupled to the fourth node, and a second electrode of the first transistor is electrically coupled to the third node.

A control electrode of the second transistor is electrically coupled to the first node, a second electrode of the second transistor is electrically coupled to the fourth node, and a first electrode of the second transistor is electrically coupled to the first voltage terminal.

A first terminal of the first capacitor is electrically coupled to the third clock signal terminal, and a second terminal of the first capacitor is electrically coupled to the fourth node.

In a specific implementation, the second input circuit may include a first transistor controlled by the third clock signal terminal, a second transistor controlled by the potential at the first node, and a first capacitor controlling a potential at the fourth node according to the third clock signal terminal, and the first transistor controls connection or disconnection between the fourth node and the third node under control of the clock signal provided by the third clock signal terminal; under control of the potential at the first node, the second transistor controls connection or disconnection between the fourth node and the first voltage terminal; and the first capacitor controls the potential at the fourth node according to the clock signal provided by the third clock signal terminal.

In an embodiment, the second input circuit includes a first transistor, a second transistor and a first capacitor.

A control electrode of the first transistor is electrically coupled to the input control terminal, a first electrode of the first transistor is electrically coupled to the fourth node, and a second electrode of the first transistor is electrically coupled to the third node.

A control electrode of the second transistor is electrically coupled to the first node, a second electrode of the second transistor is electrically coupled to the fourth node, and a first electrode of the second transistor is electrically coupled to the first voltage terminal.

A first terminal of the first capacitor is electrically coupled to a direct-current (DC) voltage terminal, and a second terminal of the first capacitor is electrically coupled to the fourth node.

In an embodiment of the present disclosure, the DC voltage terminal may be the first voltage terminal or the second voltage terminal, but is not limited thereto.

In a specific implementation, the first terminal of the first capacitor may not be electrically coupled to the input control terminal, and may be coupled to a DC voltage signal, so as to obtain a characteristic of stabilizing the potential at the fourth node.

In an embodiment, the second input circuit includes a first transistor, a second transistor and a first capacitor.

A control electrode of the first transistor is electrically coupled to the input control terminal, a first electrode of the first transistor is electrically coupled to the fourth node, and a second electrode of the first transistor is electrically coupled to the third node.

A control electrode of the second transistor is electrically coupled to the first node, a second electrode of the second transistor is electrically coupled to the fourth node, and a first electrode of the second transistor is electrically coupled to the first voltage terminal.

A first terminal of the first capacitor is electrically coupled to the input terminal, and a second terminal of the first capacitor is electrically coupled to the fourth node.

In a specific implementation, the first terminal of the first capacitor may be electrically coupled to the input terminal, and may also stabilize the potential at the fourth node.

In an embodiment of the present disclosure, the first capacitor may also be a parasitic capacitor between a control electrode of a seventh transistor and a first electrode of a seventh transistor included in the control circuit, or the first capacitor may also be a parasitic capacitor between the control electrode of the first transistor and the first electrode of the first transistor included in the second input circuit; and the capacitance value of the first capacitor is far smaller than that of a third capacitor, used for stabilizing the potential at the third node N3, of a voltage stabilizing sub-circuit in the output circuit, so as to reduce the coupling effect, and reduce the stress problem of a fifth transistor, of which a control electrode is electrically coupled to the third node N3, of an output sub-circuit in the output circuit.

In an embodiment of the present disclosure, the control circuit may include a seventh transistor.

A control electrode of the seventh transistor is electrically coupled to the fourth node, a first electrode of the seventh transistor is electrically coupled to the first voltage terminal, and a second electrode of the seventh transistor is coupled to the first node.

In a specific implementation, the control circuit includes a seventh transistor, and the seventh transistor controls connection or disconnection between the first node and the first voltage terminal under control of the potential at the fourth node.

Further, the control circuit may further include a fourth capacitor.

A first terminal of the fourth capacitor is electrically coupled to the first voltage terminal, a second terminal of the fourth capacitor is electrically coupled to the first node, and the fourth capacitor may stabilize the potential at the first node.

In an embodiment, the first input circuit may include a third transistor and a fourth transistor.

A control electrode of the third transistor is electrically coupled to the second clock signal terminal, a first electrode of the third transistor is electrically coupled to the second voltage terminal, and a second electrode of the third transistor is electrically coupled to the third node.

A control electrode of the fourth transistor is electrically coupled to the second clock signal terminal, a second electrode of the fourth transistor is electrically coupled to the first node, and a first electrode of the fourth transistor is electrically coupled to the input terminal.

Figure 2:
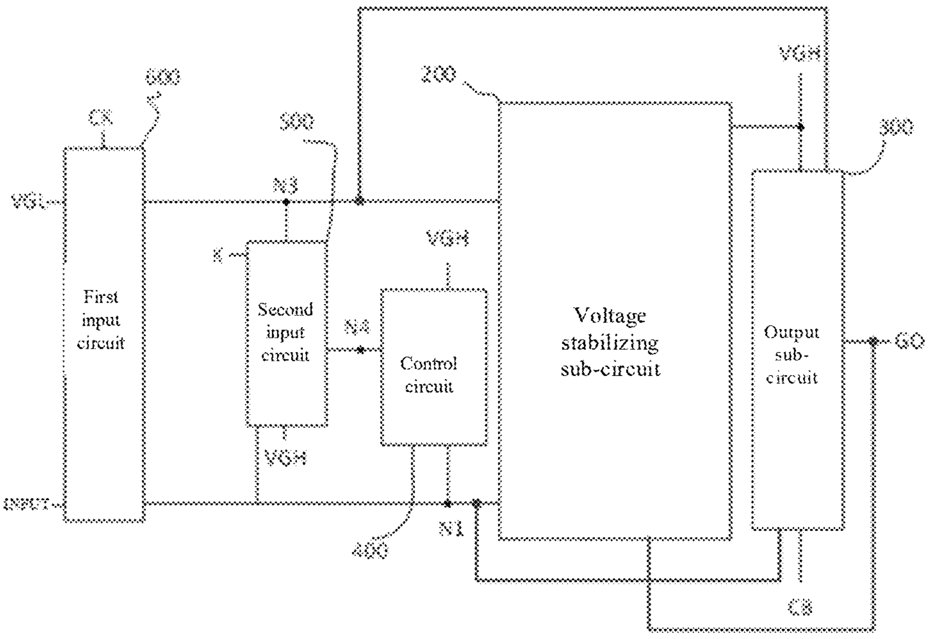
FIG. 2 is a schematic diagram of a shift register unit according to at least one embodiment of the present disclosure.

According to a specific implementation, as shown in FIG. 2, on the basis of the embodiment of the shift register unit shown in FIG. 1, the output circuit may include a voltage stabilizing sub-circuit 200 and an output sub-circuit 300.

The voltage stabilizing sub-circuit 200 is electrically coupled to the third node N3, an output terminal GO, and the first node N1, respectively, and is configured to maintain the potential at the third node N3 and control the potential at the first node N1 according to a signal output by the output terminal GO.

The output sub-circuit 300 is respectively electrically coupled to the third node N3, the first node N1, the first voltage terminal VGH, the first clock signal terminal CB, and the output terminal GO, and is configured to control provision of the first voltage signal to the output terminal GO under control of the potential at the third node N3, and control provision of the first clock signal to the output terminal GO under control of the potential at the first node N1.

As shown in FIG. 2, the voltage stabilizing sub-circuit 200 may be further electrically coupled to the first voltage terminal VGH.

In the embodiment of the shift register unit shown in FIG. 2, the voltage stabilizing sub-circuit 200 maintains the potential at the third node N3, and controls the potential at first node N1 according to the signal output by the output terminal GO; and the output sub-circuit 300 provides the first voltage signal to the output terminal GO under control of third node N3, and controls the provision of the first clock signal to the output terminal GO under control of the potential at first node N1.

In an embodiment, the voltage stabilizing sub-circuit includes a second capacitor and a third capacitor.

A first terminal of the second capacitor is coupled to the first node, and a second terminal of the second capacitor is coupled to the output terminal.

A first terminal of the third capacitor is coupled to the third node, and a second terminal of the third capacitor is coupled to the first voltage terminal.

The output sub-circuit includes a fifth transistor and a sixth transistor.

A control electrode of the fifth transistor is electrically coupled to the third node, a first electrode of the fifth transistor is electrically coupled to the first voltage terminal, and a second electrode of the fifth transistor is electrically coupled to the output terminal.

A control electrode of the sixth transistor is electrically coupled to the first node, a first electrode of the sixth transistor is electrically coupled to the first clock signal terminal, and a second electrode of the sixth transistor is electrically coupled to the output terminal.

Figure 3:
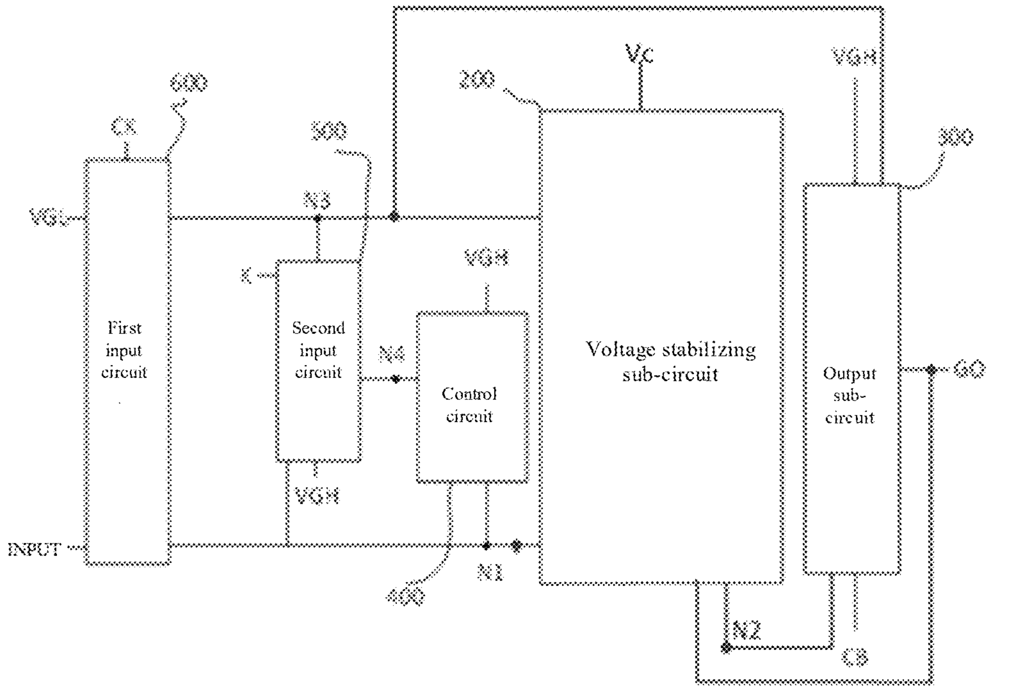
FIG. 3 is a schematic diagram of a shift register unit according to at least one embodiment of the present disclosure.

According to another specific implementation, as shown in FIG. 3, on the basis of the embodiment of the shift register unit shown in FIG. 1, the output circuit may include a voltage stabilizing sub-circuit 200 and an output sub-circuit 300.

The voltage stabilizing sub-circuit 200 is electrically coupled to the third node N3, the output terminal GO, the first node N1, the second node N2, and a control voltage terminal Vc, respectively, and is configured to maintain the potential at the third node N3, control connection or disconnection between the first node N1 and the second node N2 under control of a control voltage signal provided by the control voltage terminal Vc, and control the potential at the second node N2 according to a signal output by the output terminal GO.

The output sub-circuit 300 is electrically coupled to the third node N3, the second node N2, the first voltage terminal VGH, the first clock signal terminal CB, and the output terminal GO, respectively, and is configured to control the provision of the first voltage signal to the output terminal GO under control of the potential at the third node N3, and control the provision of the first clock signal to the output terminal GO under control of the potential at the second node N2.

In the shift register unit shown in FIG. 3, the voltage stabilizing sub-circuit 200 maintains the potential at third node N3, and the voltage stabilizing sub-circuit 200 controls connection or disconnection between the first node N1 and the second node N2 under control of the control voltage signal, and controls the potential at the second node N2 according to the signal output by the output terminal GO; and the output sub-circuit 300 provides the first voltage signal to the output terminal GO under control of the third node N3, and controls the provision of the first clock signal to the output terminal GO under control of the potential at the second node N2.

In the embodiment shown in FIG. 3, the second node N2 is additionally provided, so that when the potential at second node N2 is too low, the voltage stabilizing sub-circuit 200 controls the first node N1 and the second node N2 to be disconnected under control of the control voltage signal, thereby preventing the potential at the first node N1 from being too low, and preventing a transistor whose source electrode or drain electrode is electrically coupled to the first node N1 from having threshold voltage drift to cause circuit instability.

In an embodiment, the voltage stabilizing sub-circuit includes an eighth transistor, a second capacitor, and a third capacitor.

A control electrode of the eighth transistor is electrically coupled to the control voltage terminal, a first electrode of the eighth transistor is electrically coupled to the first node, and a second electrode of the eighth transistor is electrically coupled to the second node.

A first terminal of the second capacitor is coupled to the second node, and a second terminal of the second capacitor is coupled to the output terminal.

A first terminal of the third capacitor is coupled to the third node, and a second terminal of the third capacitor is coupled to the first voltage terminal.

The output sub-circuit includes a fifth transistor and a sixth transistor.

A control electrode of the fifth transistor is electrically coupled to the third node, a first electrode of the fifth transistor is electrically coupled to the first voltage terminal, and a second electrode of the fifth transistor is electrically coupled to the output terminal.

A control electrode of the sixth transistor is electrically coupled to the second node, a first electrode of the sixth transistor is electrically coupled to the first clock signal terminal, and a second electrode of the sixth transistor is electrically coupled to the output terminal.

The control voltage terminal is the second voltage terminal or the second clock signal terminal.

In a preferable case, the eighth transistor may be a double-gate transistor, so as to prevent the phenomenon of drain induced barrier lowering (DIBL) at the eighth transistor T8 due to the too low potential of the second node N2 (for example, the potential of the second node N2 is −15V to −10V).

In an embodiment, the output sub-circuit may further include a fifth capacitor.

A first terminal of the fifth capacitor is electrically coupled to the second node, and a second terminal of the fifth capacitor is electrically coupled to the DC voltage terminal.

In a specific implementation, the output sub-circuit may further include a fifth capacitor, and when the signal output by the output terminal jumps from a high-voltage signal to a low-voltage signal, the jump potential at the second node is reduced (for example, the jump potential varies from the potential of −15V to −20V to the potential of −10V to −15V or higher) due to the voltage division of the second capacitor and the fifth capacitor, so that the threshold voltage shift of the eighth transistor due to DIBL is reduced, and the stability of the eighth transistor T8 is improved.

Figure 4A:
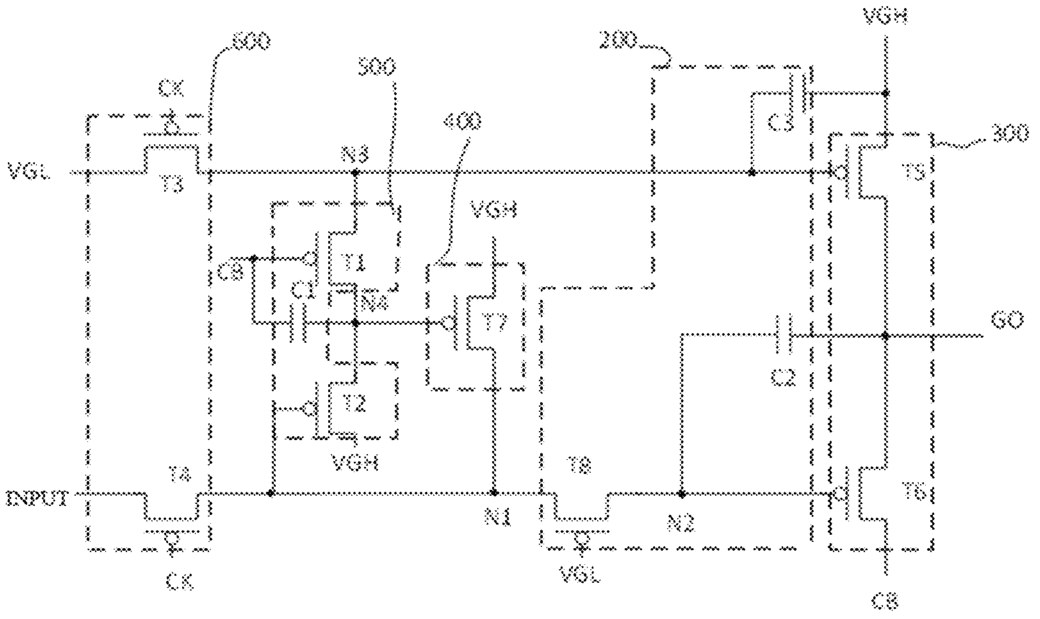
FIG. 4*a* is an equivalent schematic diagram of a shift register unit according to an embodiment of the present disclosure.

FIG. 4*a* is an equivalent schematic diagram of a shift register unit according to a first embodiment of the present disclosure.

The first input circuit 600 includes a third transistor T3 and a fourth transistor T4, a gate electrode of the third transistor T3 is coupled to a second clock signal terminal CK, a drain electrode of the third transistor T3 is coupled to a second voltage terminal VGL, and a source electrode of the third transistor T3 is coupled to a third node N3; a gate electrode of the fourth transistor T4 is coupled to the second clock signal terminal CK, a source electrode of the fourth transistor T4 is coupled to a first node N1, and a drain electrode of the fourth transistor T4 is coupled to an input terminal INPUT. When a second clock signal provided by the second clock signal terminal CK is at a low voltage, the third transistor T3 and the fourth transistor T4 are in an on state, and when the second clock signal provided by the second clock signal terminal CK is at a high voltage, the third transistor T3 and the fourth transistor T4 are in an off state.

The second input circuit 500 includes a first transistor T1, a second transistor T2 and a first capacitor C1.

A gate electrode of the first transistor T1 is coupled to a first clock signal terminal CB, a drain electrode of the first transistor T1 is coupled to a fourth node N4, and a source electrode of the first transistor T1 is coupled to the third node N3.

A gate electrode of the second transistor T2 is coupled to the first node N1, a source electrode of the second transistor T2 is coupled to the fourth node N4, and a drain electrode of second transistor T2 is coupled to the first voltage terminal VGH.

A first terminal of the first capacitor C1 is coupled to the first clock signal terminal CB, and a second terminal of the first capacitor C1 is coupled to the fourth node N4.

An output sub-circuit 300 in the output circuit includes a fifth transistor T5 and a sixth transistor T6.

A gate electrode of the fifth transistor T5 is coupled to the third node N3, a drain electrode of the fifth transistor T5 is coupled to the first voltage terminal VGH, and a source electrode of the fifth transistor T5 is coupled to an output terminal GO.

A gate electrode of the sixth transistor T6 is coupled to a second node N2, a drain electrode of the sixth transistor T6 is coupled to the first clock signal terminal CB, and a source electrode of the sixth transistor T6 is coupled to the output terminal GO.

The control circuit 400 includes a seventh transistor T7.

A gate electrode of the seventh transistor T7 is coupled to the fourth node N4, a drain electrode of the seventh transistor T7 is coupled to the first voltage terminal VGH, and a source electrode of the seventh transistor T7 is coupled to the first node N1.

A voltage stabilizing sub-circuit 200 in the output circuit includes an eighth transistor T8, a second capacitor C2, and a third capacitor C3.

A gate electrode of the eighth transistor T8 is coupled to the second voltage terminal VGL, a drain electrode of the eighth transistor T8 is coupled to the first node N1, and a source electrode of the eighth transistor T8 is coupled to the second node N2.

A first terminal of the second capacitor C2 is coupled to the second node N2, and a second terminal of the second capacitor C2 is coupled to the output terminal GO.

A first terminal of the third capacitor C3 is coupled to the third node N3, and a second terminal of the third capacitor C3 is coupled to the first voltage terminal VGH.

In the embodiment of the shift register unit shown in FIG. 4*a*, all the transistors may be P-type thin film transistors, but are not limited thereto.

In the embodiment of the shift register unit shown in FIG. 4*a*, the first voltage terminal may be a high voltage terminal, and the second voltage terminal may be a low voltage terminal, but the embodiment is not limited thereto.

An embodiment of the present disclosure further provides a driving method of the shift register unit described above, and the driving method may include the following operations.

In a first phase, the first input circuit, provides the input signal to the first node and provides the second voltage signal to the third node, under control of the second clock signal, and the output terminal outputs the first voltage signal.

In a second phase, the output circuit maintains the potential at the third node; the second input circuit controls connection between the fourth node and the third node under control of the input control signal, so that the potential at the fourth node is the second voltage signal, and the control circuit provides the first voltage signal to the first node under control of the potential at the fourth node; and the output circuit provides the first voltage signal to the output terminal under control of the potential at the third node.

In a third phase, the first input circuit provides a signal of the input terminal to the first node under control of the second clock signal, the first input circuit provides the second voltage signal to the third node under control of the second clock signal, the output circuit provides the first voltage signal to the output terminal under control of the potential at the third node, and the output circuit provides the first clock signal to the output terminal under control of the potential at the first node.

In a fourth phase, the second input circuit writes the first voltage signal into the third node under control of the potential at the first node and the input control signal, the potential at the first node is the second voltage, and the output circuit provides the first clock signal to the output terminal.

In a fifth phase, the second input circuit writes the first voltage signal into the third node under control of the potential at the first node and the input control signal, the potential at the first node is the second voltage signal, and the output circuit provides the first clock signal to the output terminal.

In a sixth phase, the first input circuit provides the input signal to the first node under control of the second clock signal, and the first input circuit provides the second voltage signal to the third node under control of the second clock signal; and the output circuit provides the first voltage signal to the output terminal under control of the potential at the third node.

In addition, a seventh phase may be further provided subsequent to the sixth phase, and in the seventh phase, the first input circuit and the second input circuit maintain the potential at the first node as the first voltage, the potential at the third node as the second voltage, and the output circuit provides the first voltage signal to the output terminal. For some specific implementations, the driving method may be specifically implemented as follows.

In the first phase, the input signal is provided to the first node, the signal at the first node is transmitted to the second node through the eighth transistor, the sixth transistor is turned off, the fifth transistor is turned off, the second voltage signal is provided to the third node, and the output terminal outputs the first voltage signal.

In the second phase, the first voltage signal is provided to the first node, the signal at the first node is transmitted to the second node, the sixth transistor is turned off, the first transistor is turned on, and the output terminal keeps outputting the first voltage signal under the effect of the first capacitor and the third capacitor.

In the third phase, the input signal is provided to the first node, the signal at the first node is transmitted to the second node through the eighth transistor, the sixth transistor is turned on, the second voltage signal is provided to the third node, and the output terminal outputs the first voltage signal and the first clock signal.

In the fourth phase, the second voltage signal is provided to the third node, the fifth transistor is turned off, the first node keeps the low potential of the previous phase, and the first clock signal is output to the output terminal through the sixth transistor.

In the fifth phase, under the bootstrap effect of the second capacitor, the potential at the second node keeps the low potential, the sixth transistor is turned on, and the first clock signal is provided to the output terminal.

In the sixth phase, the input signal is provided to the first node, the sixth transistor is turned off, the second voltage signal is provided to the third node, the fifth transistor is turned on, and the first voltage signal is provided to the output terminal.

In the seventh phase, the first voltage signal is provided to the first node, the sixth transistor is turned off, the potential at the third node keeps the low potential of the previous phase, the fifth transistor is turned on, and the first voltage signal is provided to the output terminal.

In the eighth phase, which is the same as the sixth phase, that is, the input signal is provided to the first node, the sixth transistor is turned off, the second voltage signal is provided to the third node, the fifth transistor is turned on, and the first voltage signal is provided to the output terminal.

In an exemplary embodiment, the driving method may further include the following.

The potential at the first clock signal and the potential at the second clock signal keep switching between a high voltage and a low voltage respectively, and one of the first clock signal and the second clock signal, whose voltage changes from low to high, changes first.

A clock signal provided by a third clock signal line is inverted with respect to the first clock signal, and a clock signal provided by a fourth clock signal line is inverted with respect to the second clock signal.

The explanation is given by taking the case that all transistors in FIG. 4*a* are P-type transistors as an example. The second voltage terminal VGL continuously outputs a low voltage, and the first voltage terminal VGH continuously outputs a high voltage. When a low voltage signal is applied to the control electrode of the P-type transistor, the P-type transistor is turned on, and when a high voltage signal is applied to the control electrode of the P-type transistor, the P-type transistor is turned off. Accordingly, the clock signal is a signal that periodically switches between two different levels, and these two levels are also generally used to turn the transistor on and off, respectively, so the higher one of the two levels is also generally referred to as the high voltage, and the lower one is generally referred to as the low voltage.

It should be understood that the specific voltage values of the high/low voltages provided by the first and second voltage terminals are not necessarily equal to the voltage values of the high/low voltages of the clock signal, respectively (although they may be equal for the purpose of driving simplicity).

Figure 4B:
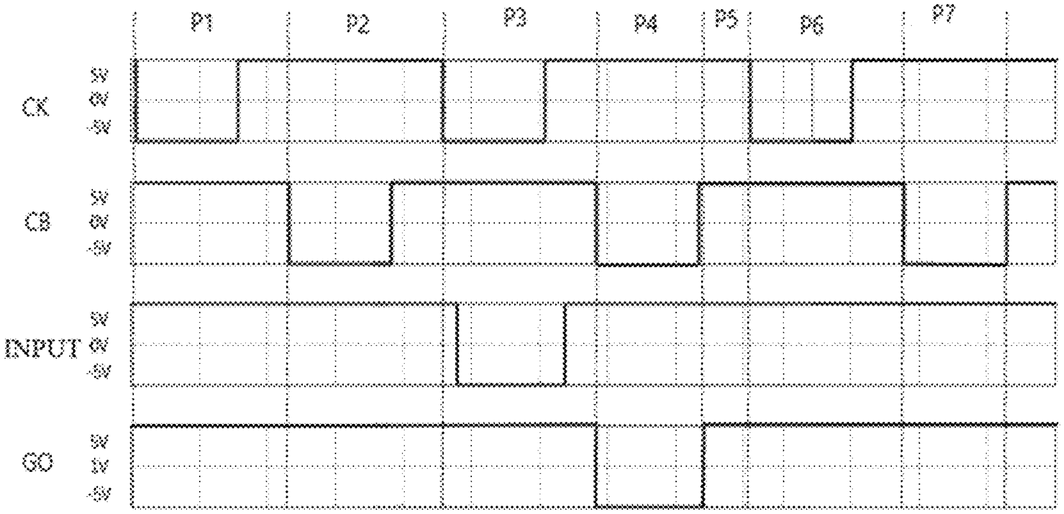
FIG. 4*b* is a schematic timing diagram of the shift register unit.

FIG. 4*b* is a schematic timing diagram of the operation of the shift register unit, a low voltage signal output by the output terminal GO is one phase later in timing than a low voltage signal provided by the input terminal INPUT, and a low voltage signal output by the output terminal GO of a shift register unit of a current stage is an input signal of the input terminal INPUT of a shift register unit of a next stage, that is, a low voltage signal output by the output terminal GO of a shift register unit of the current stage at the fourth phase P4 is an input signal of the input terminal INPUT of a shift register unit of the next stage at the third phase P3.

In FIG. 4*b*, reference symbol P1 represents the first phase, reference symbol P2 represents the second phase, reference symbol P3 represents the third phase, reference symbol P4 represents the fourth phase, reference symbol P5 represents the fifth phase, reference symbol P6 represents the sixth phase, and reference symbol P7 represents the seventh phase.

Figure 5:
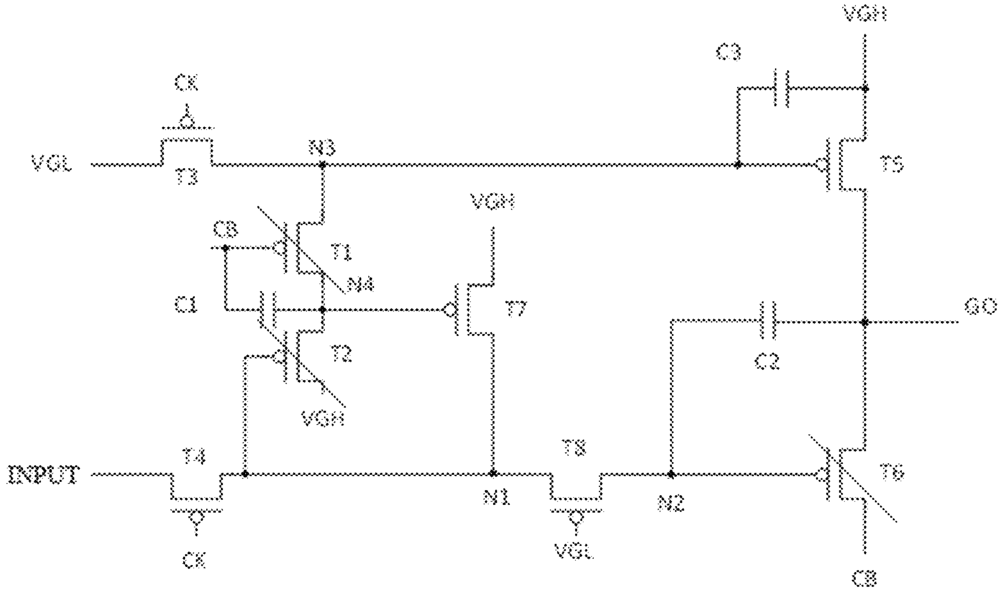
FIG. 5 is a schematic state diagram of a shift register unit according to a first embodiment of the present disclosure at a first phase.
Figure 6:
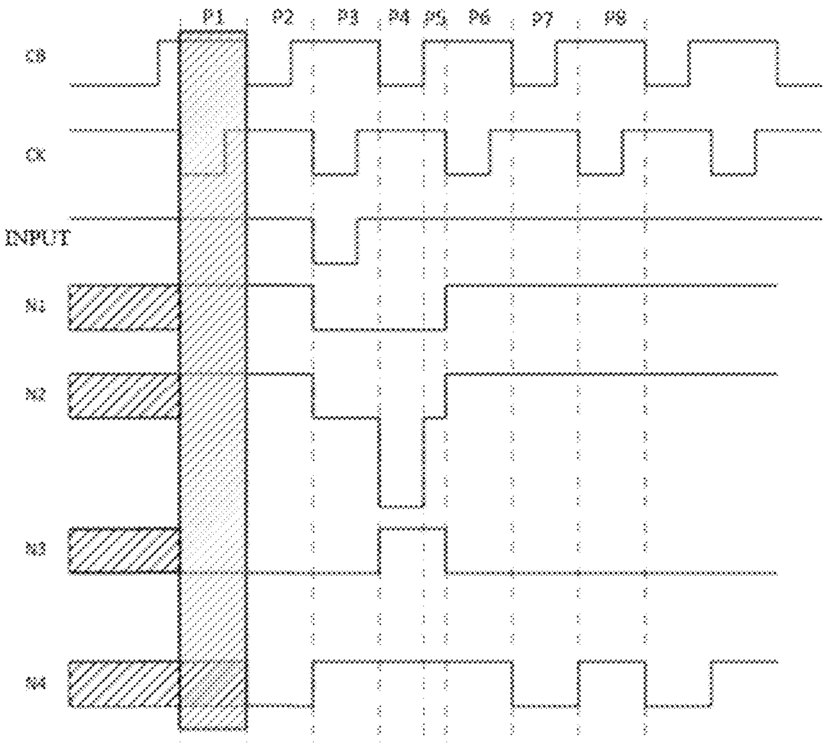
FIG. 6 is a schematic timing diagram of the shift register unit according to the first embodiment of the present disclosure at the first phase.

FIG. 5 is a schematic state diagram of a shift register unit according to a first embodiment of the present disclosure at a first phase. FIG. 6 is a schematic timing diagram of the shift register unit according to the first embodiment of the present disclosure at the first phase.

In the first phase, the signal of the input terminal is provided to the first node, the signal of the first node is transmitted to the second node through the eighth transistor, the sixth transistor is turned off, the fifth transistor is turned off, the second voltage signal is provided to the third node, and the output terminal outputs the first voltage signal.

In the first embodiment, as shown in FIGS. 5 and 6, in the first phase P1, the second clock signal provided by the second clock signal terminal CK is at a low voltage, the third transistor T3 and the fourth transistor T4 are turned on, the input signal is provided to the first node N1 (the input terminal INPUT is configured to provide the input signal), the eighth transistor T8 is turned on, the signal at the first node N1 is transmitted to the second node N2 through the eighth transistor T8, the potential at the first node N1 and the potential at the second node N2 are both at a high voltage, the second transistor T2 and the sixth transistor T6 are turned off, and the first clock signal provided by the first clock signal terminal CB cannot be provided to the output terminal GO.

In the first phase P1, the third transistor T3 is turned on to provide the second voltage signal to the third node N3, the potential at the third node N3 is at a low voltage, and the fifth transistor T5 is turned on to provide the first voltage signal to the output terminal GO; the first clock signal provided by the first clock signal terminal CB is at a high voltage, and the first transistor T1 is turned off. At this time, although the potential at the fourth node N4 is unknown, this has no influence on the potential at the first node N1 and the potential at the second node N2, and the first clock signal provided by the first clock signal terminal CB and the capacitance of the first capacitor C1 may be designed to control the potential at the fourth node N4.

Figure 7:
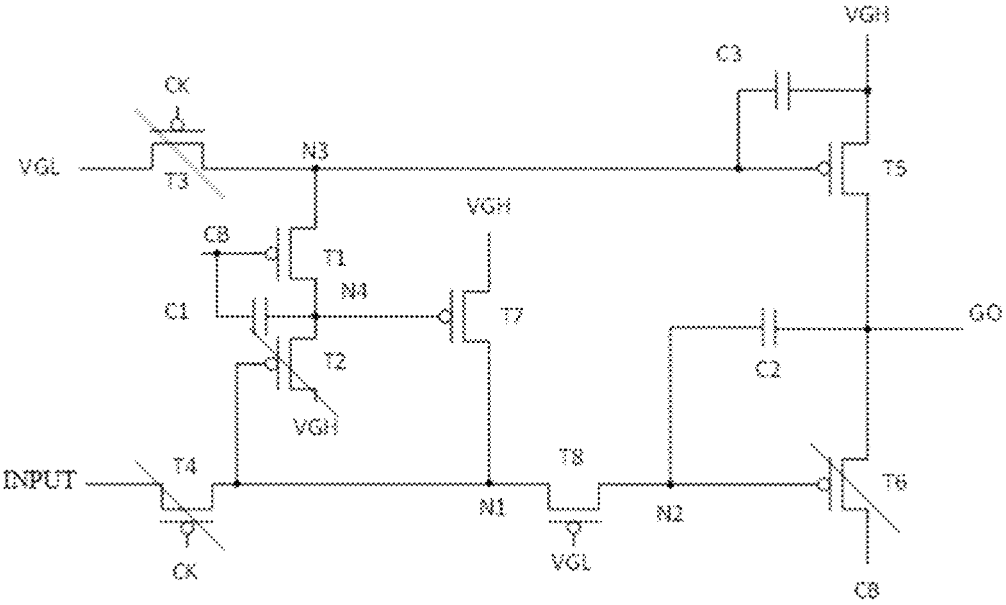
FIG. 7 is a schematic state diagram of the shift register unit according to the first embodiment of the present disclosure at a second phase.
Figure 8:
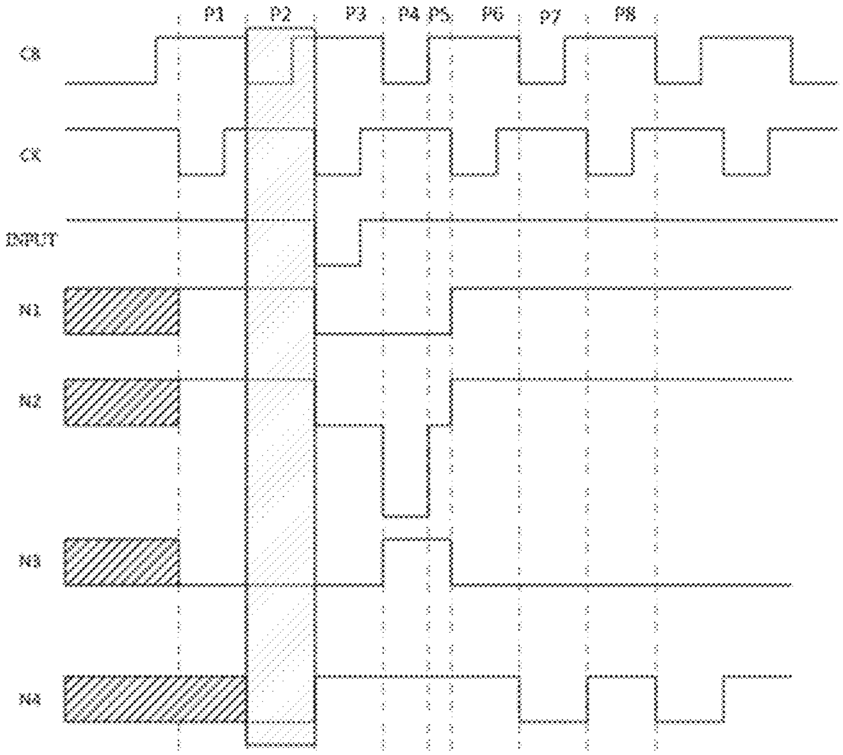
FIG. 8 is a schematic timing diagram of the shift register unit according to the first embodiment of the present disclosure at the second phase.

FIG. 7 is a schematic state diagram of the shift register unit according to the first embodiment of the present disclosure at a second phase, and FIG. 8 is a schematic timing diagram of the shift register unit according to the first embodiment of the present disclosure at the second phase.

In the second phase P2, the first voltage signal is provided to the first node, the signal at the first node is transmitted to the second node, the sixth transistor is turned off, the first transistor is turned on, and the output terminal keeps outputting the first voltage signal under the effect of the first capacitor and the third capacitor. In the first embodiment, as shown in FIGS. 7 and 8, in the second phase P2, the first clock terminal CB provides a low voltage, the second clock terminal CK provides a high voltage, and the input terminal INPUT is at a high voltage.

In the second phase P2, the second clock signal terminal CK provides a high voltage, and the third transistor T3 and the fourth transistor T4 are turned off. When the first clock signal provided by the first clock signal terminal CB changes from the high voltage to the low voltage, the first transistor T1 is turned on, causing that the potential at the third node N3 becomes $VL+(VL-VH)\times C1z/(C1z+C3z)$, and at this time, the potential at the fourth node N4 is substantially equal to the potential at the third node N3, and the potential at the fourth node N4 is equal to $VL+(VL-VH)\times C1z/(C1z+C3z)$, where VL is a voltage value of the second voltage signal provided by the second voltage terminal VGL, VH is a voltage value of the first voltage signal provided by the first voltage terminal VGH, C1*z* is a capacitance value of the first capacitor C1, and C3*z* is a capacitance value of the third capacitor C3, thereby causing the seventh transistor T7 to be turned on, so that the potentials at the first node N1 and the second node N2 are at VH; the first voltage signal is transmitted from the first node N1 to the second node N2, the sixth transistor T6 is turned off, and the first clock signal provided by the first clock signal terminal CB cannot be provided to the output terminal GO, so that the potential output by the output terminal GO at this time is the first voltage signal. C3*z* is much larger than C1*z*, or the first capacitor C1 may be an integral capacitor, which may reduce the capacitive coupling effect.

Figure 9:
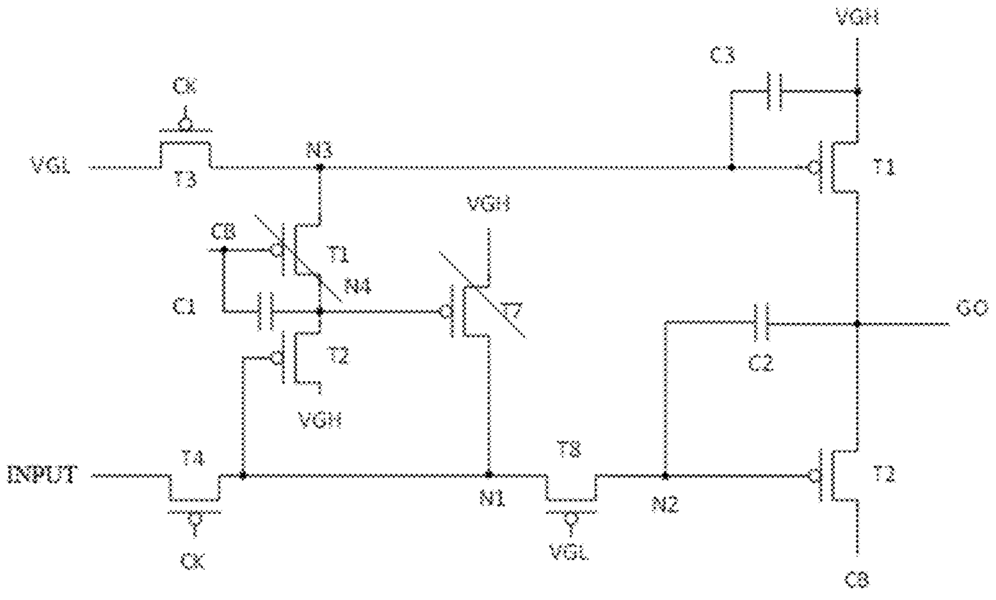
FIG. 9 is a schematic state diagram of the shift register unit according to the first embodiment of the present disclosure at a third phase.
Figure 10:
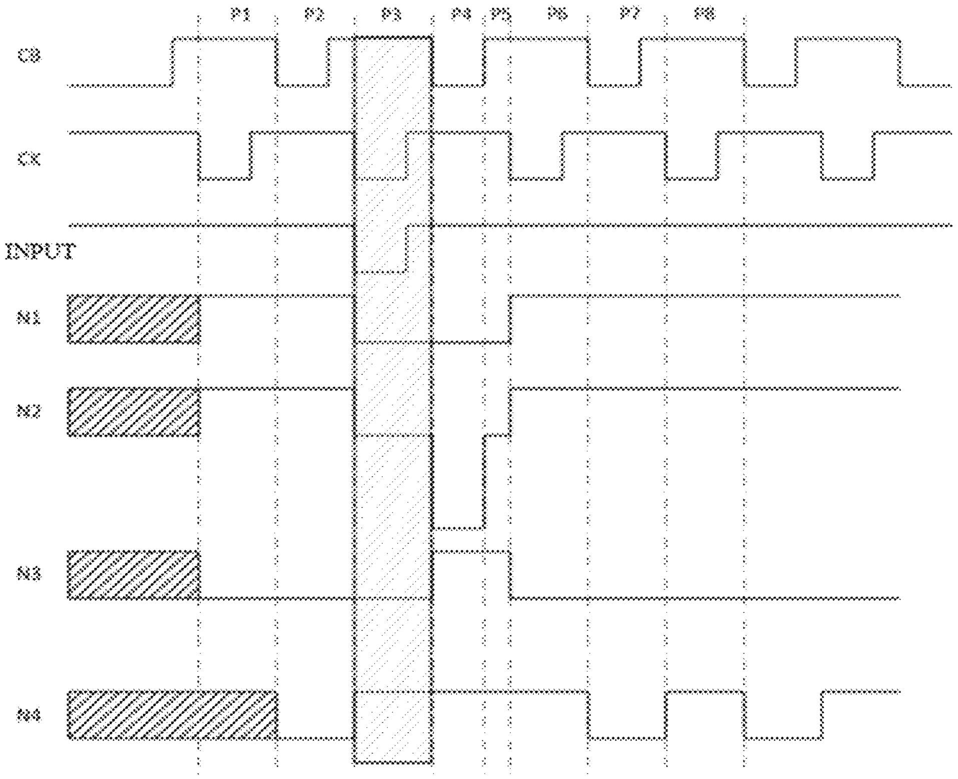
FIG. 10 is a schematic timing diagram of the shift register unit according to the first embodiment of the present disclosure at the third phase.

FIG. 9 is a schematic state diagram of the shift register unit according to the first embodiment of the present disclosure at a third phase, and FIG. 10 is a schematic timing diagram of the shift register unit according to the first embodiment of the present disclosure at the third phase.

In the third phase, the input signal is provided to the first node, the signal at the first node is transmitted to the second node through the eighth transistor, the sixth transistor is turned on, the second voltage signal is provided to the third node, and the output terminal outputs the first voltage signal and the first clock signal. In the first embodiment, as shown in FIGS. 9 and 10, in the third phase S3, the first clock signal is at a high voltage, the second clock signal is at a low voltage, and the input signal provided by the input terminal INPUT is at a low voltage. In the third phase S3, the second clock signal is at a low voltage, the third transistor T3 and the fourth transistor T4 are turned on, the input signal is provided to the first node N1, the eighth transistor T8 is turned on, the signal at the first node N1 is transmitted to the second node N2 through the eighth transistor T8, the potential at the first node N1 and the potential at the second node N2 are both at a low voltage, the second transistor T2 and the sixth transistor T6 are turned on, and the high voltage signal provided by the first clock signal terminal CB is provided to the output terminal GO. The third transistor T3 is turned on to provide the second voltage signal to the third node N3, the potential at the third node N3 is a low voltage, and the fifth transistor T5 is turned on to provide the first voltage signal to the output terminal GO. At this time, the potential at the first node N1 and the potential at the second node N2 are about VL. The potential at the third node is VL, and the potential at the fourth node N4 is VH.

Figure 11:
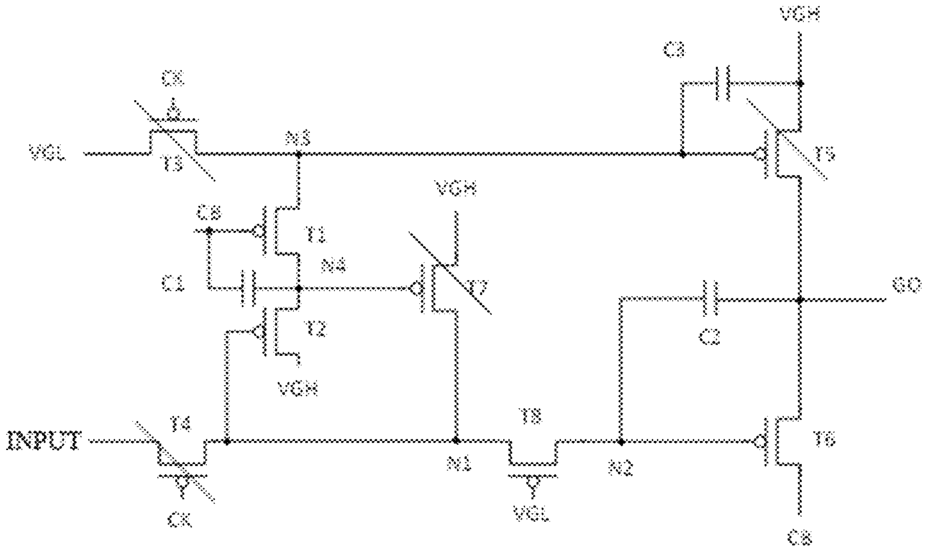
FIG. 11 is a schematic state diagram of the shift register unit according to the first embodiment of the present disclosure at a fourth phase.
Figure 12:
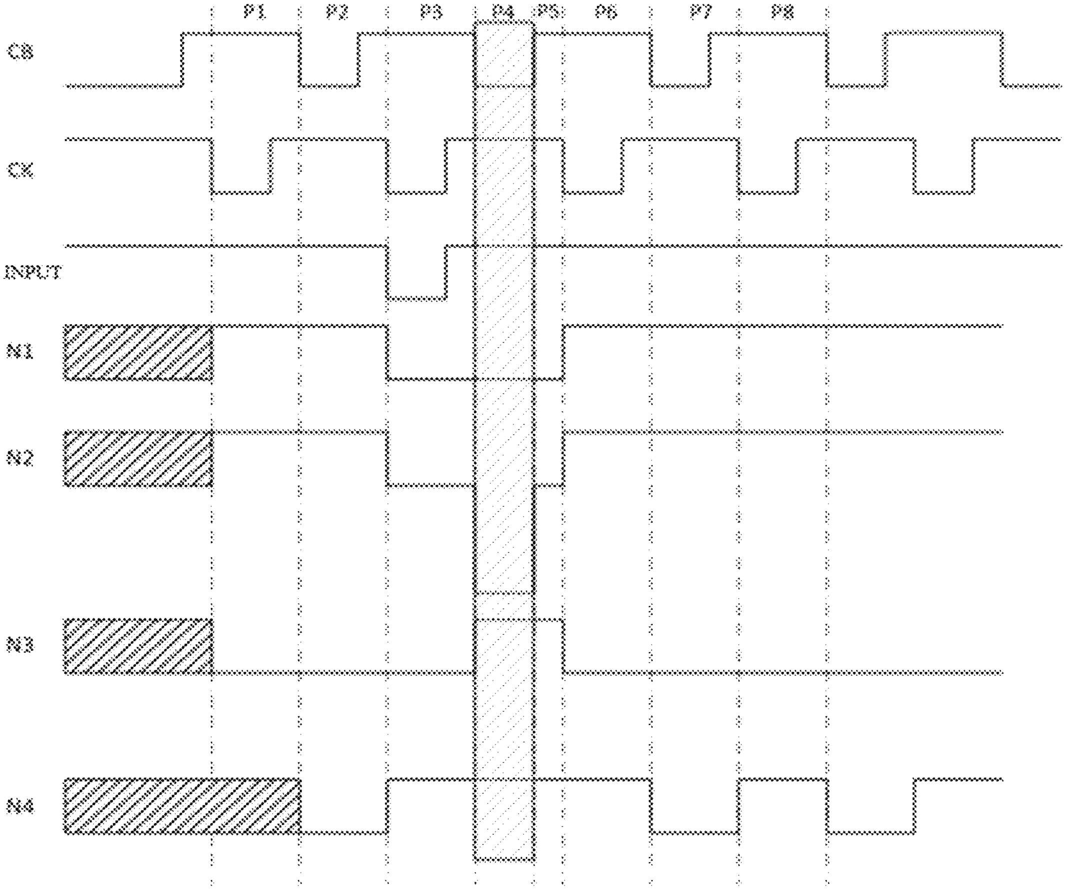
FIG. 12 is a schematic timing diagram of the shift register unit according to the first embodiment of the present disclosure at the fourth phase.

FIG. 11 is a schematic state diagram of the shift register unit according to the first embodiment of the present disclosure at a fourth phase, and FIG. 12 is a schematic timing diagram of the shift register unit according to the first embodiment of the present disclosure at the fourth phase.

In the fourth phase, the second voltage signal is provided to the third node, the fifth transistor is turned off, the potential at the first node is kept at the low potential as in the previous phase, and the first clock signal provided by the first clock signal terminal is output to the output terminal through the sixth transistor.

In the first embodiment, as shown in FIGS. 11 and 12, in the fourth phase P4, the first clock signal is at a low voltage, the second clock signal is at a high voltage, and the input terminal INPUT provides a high voltage. The third transistor T3 and the fourth transistor T4 are turned off, the potential at the first node N1 is VL, the first transistor T1 and the second transistor T2 are turned on, the first voltage signal may be provided to the third node N3 through the first transistor T1 and the second transistor T2, the fifth transistor T5 is turned off, the sixth transistor is turned on, and the output terminal GO outputs the first clock signal.

In the fourth phase P4, the potential at the third node N3 is equal to the potential at the fourth node N4, which are both VH. Under the bootstrap effect of the capacitor, the potential at the second terminal of the second capacitor C2 jumps from VH as in the previous phase to VL with the variation amount of (VL−VH), the potential at the first terminal of the second capacitor C2 is VL in the previous phase, and in the fourth phase, the potential at the first terminal of the second capacitor C2, which is also the potential at the second node N2, is (2VL−VH−Vth), where Vth is the threshold voltage of the sixth transistor T6.

Figure 13:
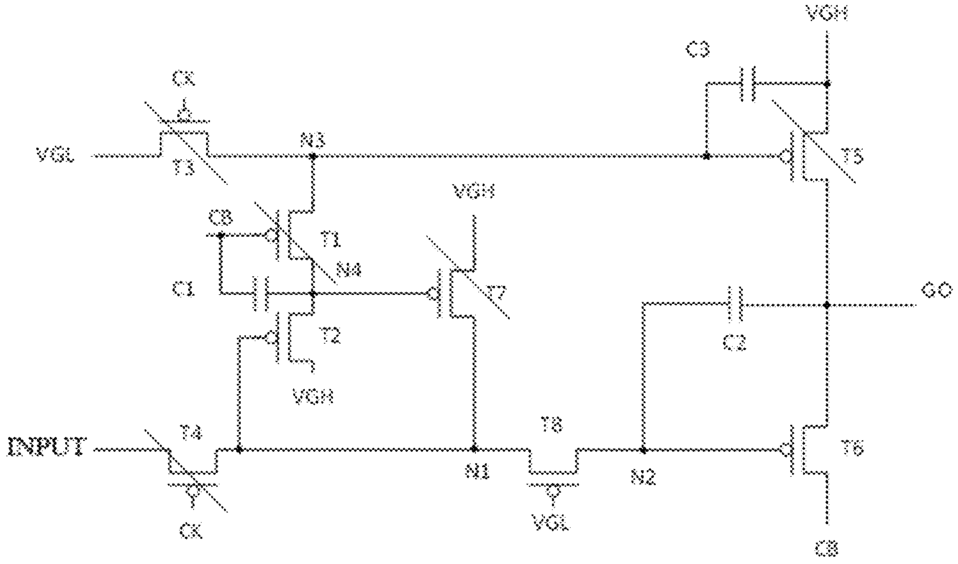
FIG. 13 is a schematic state diagram of the shift register unit according to the first embodiment of the present disclosure at a fifth phase.
Figure 14:
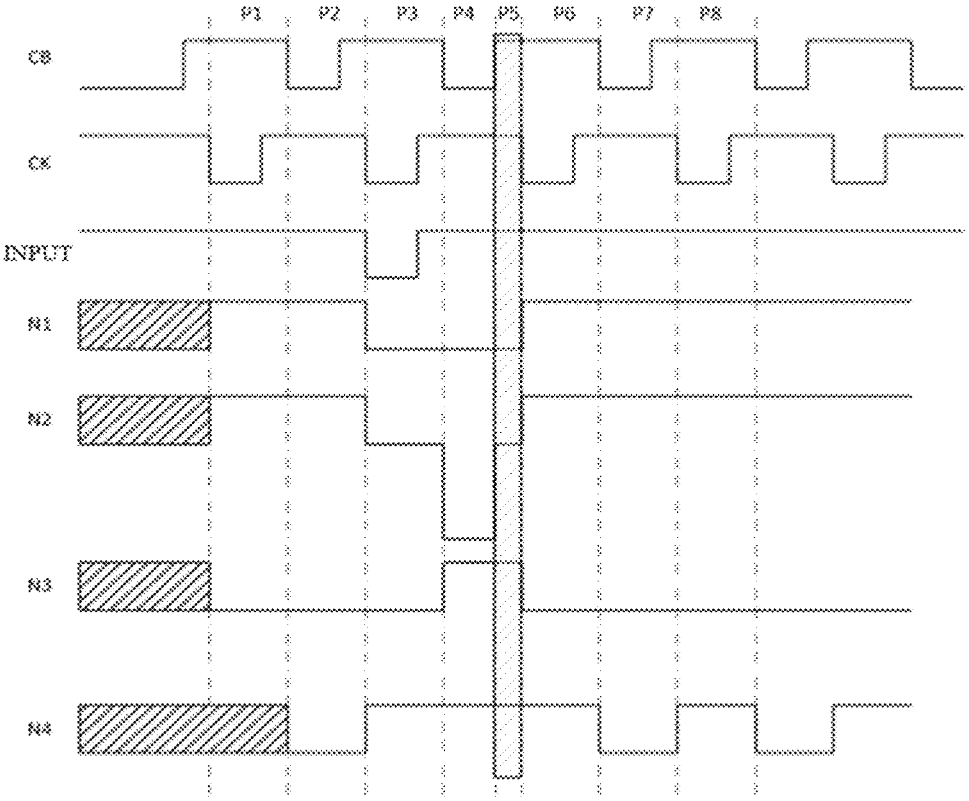
FIG. 14 is a schematic timing diagram of the shift register unit according to the first embodiment of the present disclosure at the fifth phase.

FIG. 13 is a schematic state diagram of the shift register unit according to the first embodiment of the present disclosure at a fifth phase, and FIG. 14 is a schematic timing diagram of the shift register unit according to the first embodiment of the present disclosure at the fifth phase.

In the fifth phase, under the effect of the second capacitor, the potential at the second node is kept at a low potential, the sixth transistor is turned on to provide the first clock signal to the output terminal. In the first embodiment, as shown in FIGS. 13 and 14, in the fifth phase P5, the first clock signal, the second clock signal, and the input signal provided by the input terminal INPUT are all at a high voltage. The third transistor T3, the fourth transistor T4, and the first transistor T1 are all turned off, the potential at the first node N1 is VL, and the potential at the third node N3 is equal to the potential at the fourth node N4, which are both VH. The seventh transistor T7 and the fifth transistor T5 are turned off, the sixth transistor T6 is turned on, and the output terminal GO outputs the high voltage signal provided by the first clock signal terminal CB. The potential at the second terminal of the second capacitor C2 jumps from VL as in the previous phase to VH with the variation amount of (VH−VL), the potential at the first terminal of the second capacitor C2 is (2VL−VH−Vth) in the previous phase, and in the fifth phase, the potential at the first terminal of the second capacitor C2, which is also the potential at the second node N2, is (VGL−Vth).

Figure 15:
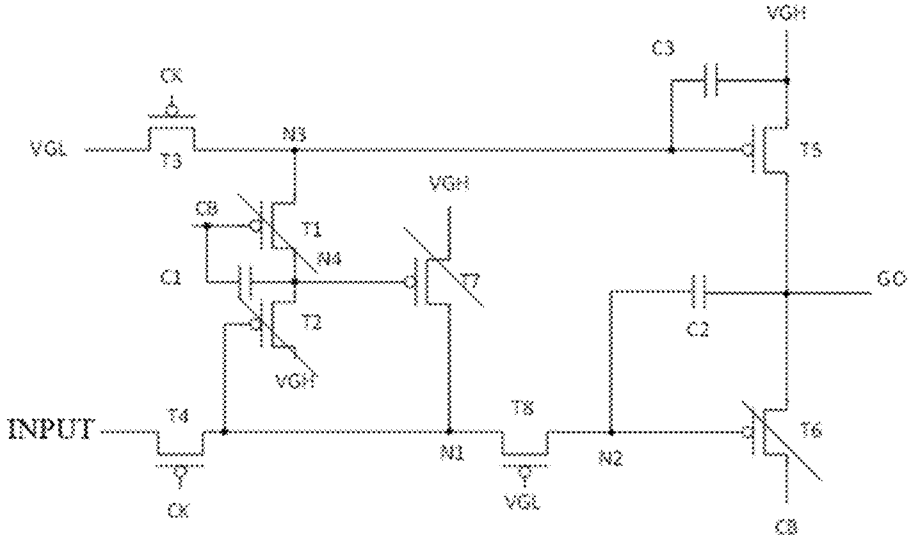
FIG. 15 is a schematic state diagram of the shift register unit according to the first embodiment of the present disclosure at a sixth phase.
Figure 16:
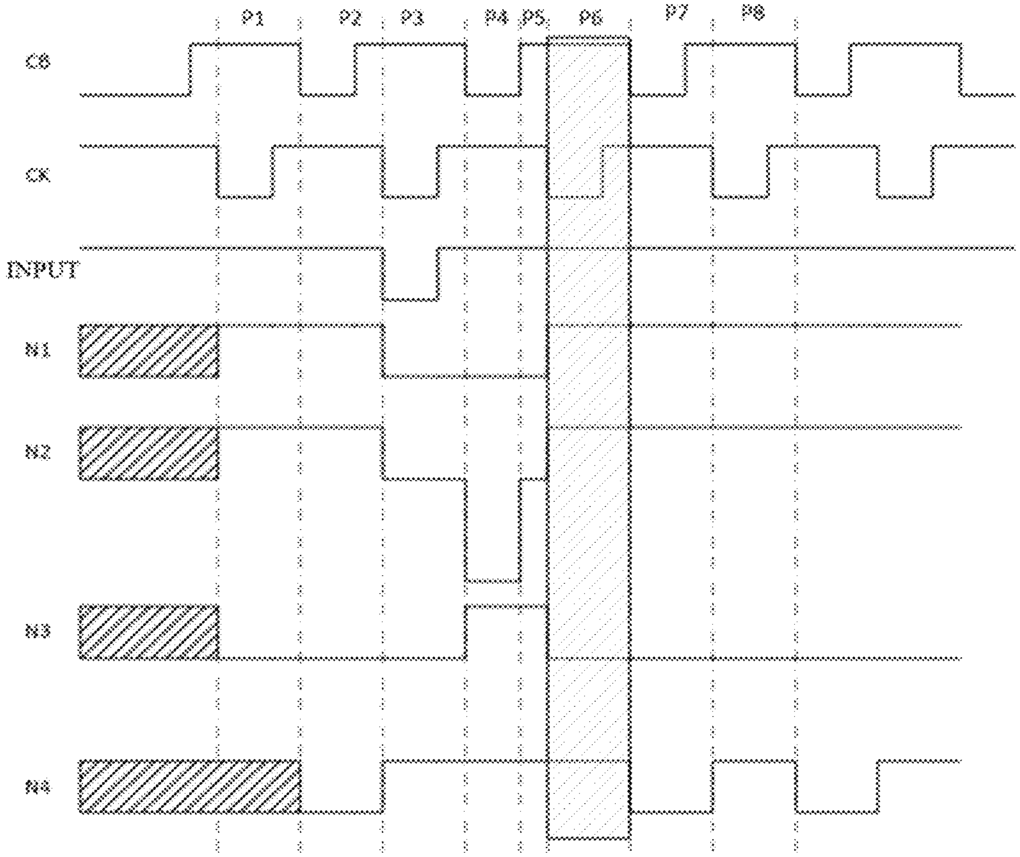
FIG. 16 is a schematic timing diagram of the shift register unit according to the first embodiment of the present disclosure at the sixth phase.

FIG. 15 is a schematic state diagram of the shift register unit according to the first embodiment of the present disclosure at a sixth phase, and FIG. 16 is a schematic timing diagram of the shift register unit according to the first embodiment of the present disclosure at the sixth phase.

In the sixth phase, the input signal is provided to the first node, the sixth transistor is turned off, the second voltage signal is provided to the third node, and the fifth transistor is turned on to provide the first voltage signal to the output terminal. In the first embodiment, as shown in FIGS. 15 and 16, in the sixth phase P6, the first clock signal is at a high voltage, the second clock signal is at a low voltage, and the input signal provided by the input terminal INPUT is at a high voltage. In the sixth phase P6, the second clock signal is at a low voltage, the third transistor T3 and the fourth transistor T4 are turned on, the input signal is provided to the first node N1, the eighth transistor T8 is turned on, the signal at the first node N1 is transmitted to the second node N2 through the eighth transistor T8, both the potential at the first node N1 and the potential at the second node N2 are at a high voltage, the second transistor T2 and the sixth transistor T6 are turned off, the second voltage signal is provided to the third node N3, the potential at the third node N3 is at a low voltage, the fifth transistor T5 is turned on, and the first voltage signal is provided to the output terminal. At this time, the potentials at the first node N1 and the second node N2 are about VH. The potential at the third node is VL, and the potential at the fourth node N4 is VH.

Figure 17:
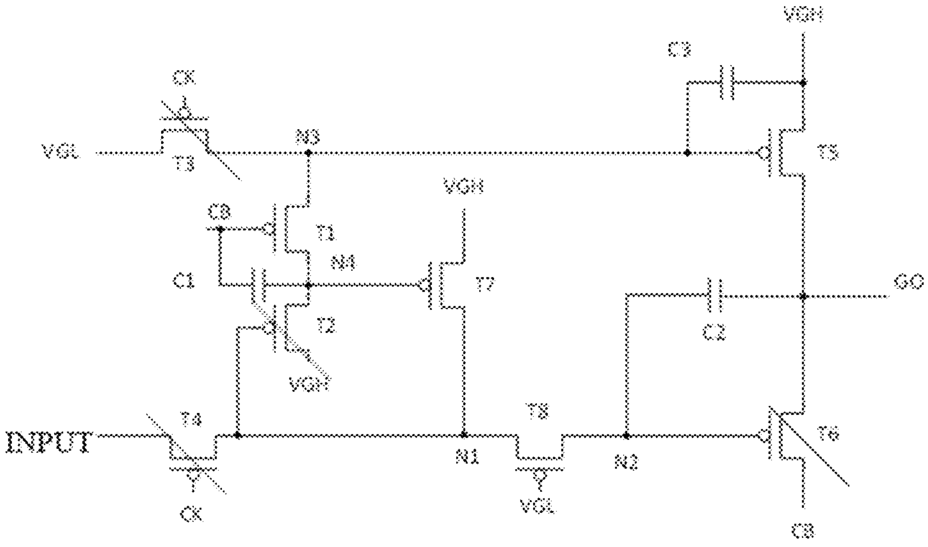
FIG. 17 is a schematic state diagram of the shift register unit at a seventh phase according to the first embodiment of the present disclosure.
Figure 18:
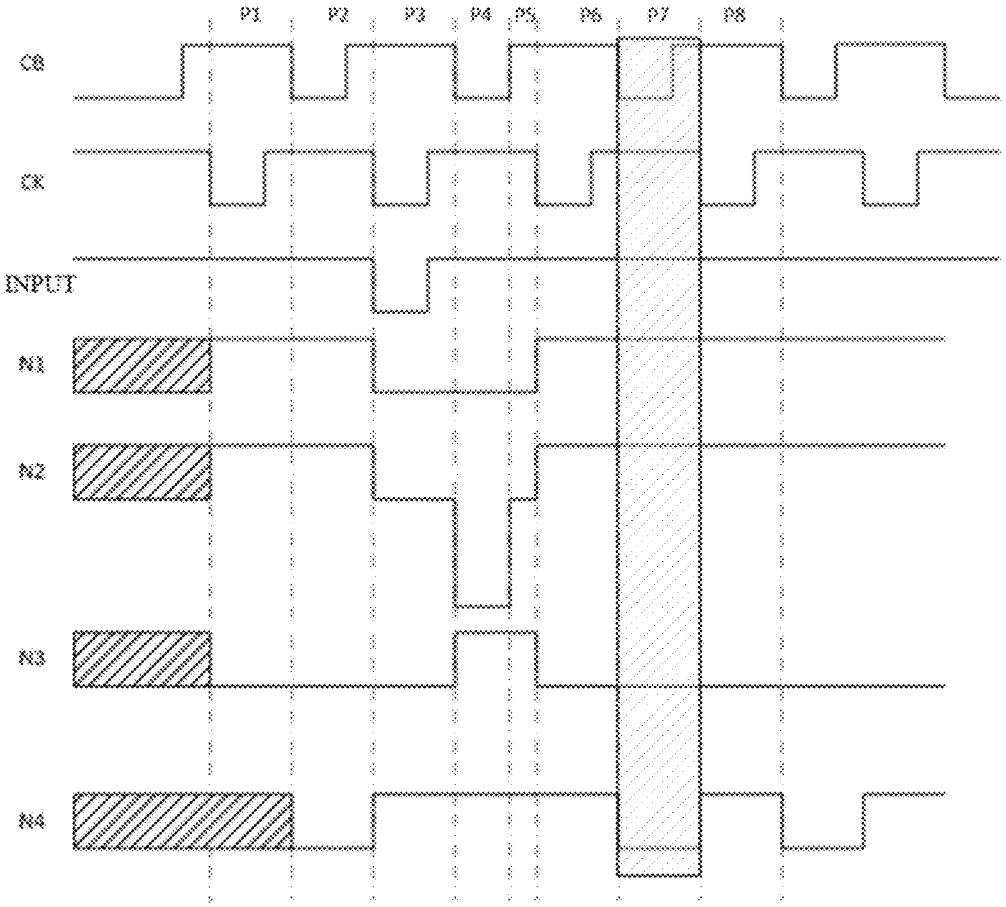
FIG. 18 is a schematic timing diagram of the shift register unit according to the first embodiment of the present disclosure at the seventh phase.

FIG. 17 is a schematic state diagram of the shift register unit according to the first embodiment of the present disclosure at a seventh phase, and FIG. 18 is a schematic timing diagram of the shift register unit according to the first embodiment of the present disclosure at the seventh phase.

In the seventh phase, the first voltage signal is provided to the first node, the sixth transistor is turned off, the potential at the third node is kept at the low potential as in the previous phase, the fifth transistor is turned on to provide the first voltage signal to the output terminal. In the first embodiment, as shown in FIGS. 17 and 18, in the seventh phase P7, the first clock signal is at a low voltage, the second clock signal is at a high voltage, and the input signal provided by the input terminal INPUT is at a high voltage. In the seventh phase P7, the second clock signal is at a high voltage, and the third transistor T3, the fourth transistor T4, and the sixth transistor T6 are turned off. The first clock signal is at a low voltage, the first transistor T1 is turned on, the potentials at the third node N3 and the fourth node N4 are about VL, the seventh transistor T7 is turned on, so that the potential at the first node N1 and the potential at the second node N2 are both VGH, the first voltage signal is provided to the second node N2 from the first node N1, the sixth transistor T6 is turned off, the first clock signal cannot be provided to the output terminal GO, and the fifth transistor T5 is turned on, so that the output terminal GO outputs the first voltage signal at this time.

The operations in the eighth phase P8 are the same as those in the sixth phase P6, and therefore, the description thereof is omitted.

Figure 19:
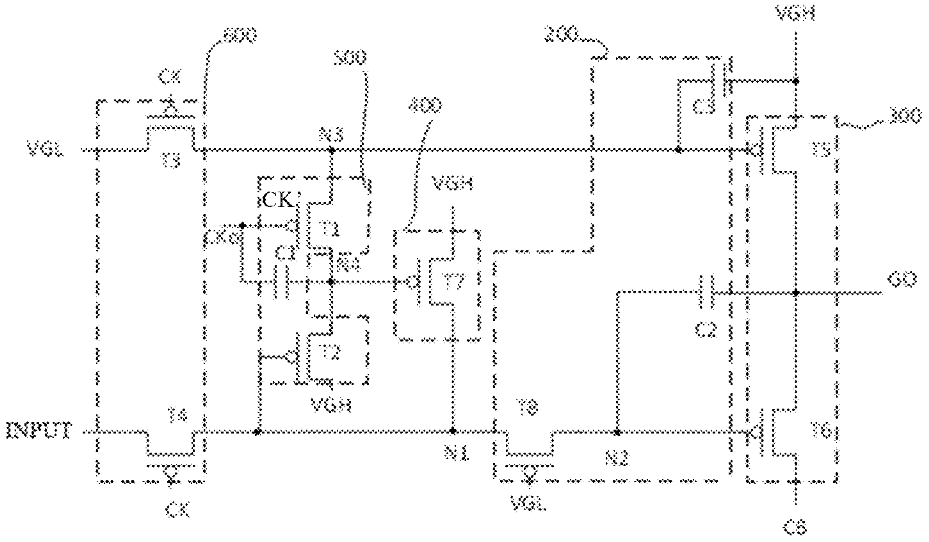
FIG. 19 is an equivalent schematic diagram of a shift register unit according to a second embodiment of the present disclosure.

FIG. 19 is an equivalent schematic diagram of a shift register unit according to a second embodiment of the present disclosure; the difference from the first embodiment is that the control electrode of the first transistor T1 is coupled to a third clock signal terminal CK'. For an odd-numbered stage of shift register unit, the control electrode of the first transistor T1 is coupled to a fourth clock signal line CKo (i.e., the third clock signal terminal CK' is coupled to the fourth clock signal line CKo). For an even-numbered stage of shift register unit, the control electrode of the first transistor T1 is coupled to a third clock signal line CBo (i.e., the third clock signal terminal CK' is coupled to the third clock signal line CBo). In FIG. 19, the explanation is given by taking the case that the third clock signal terminal CK' is electrically coupled to the fourth clock signal line CKo as an example.

Figure 20:
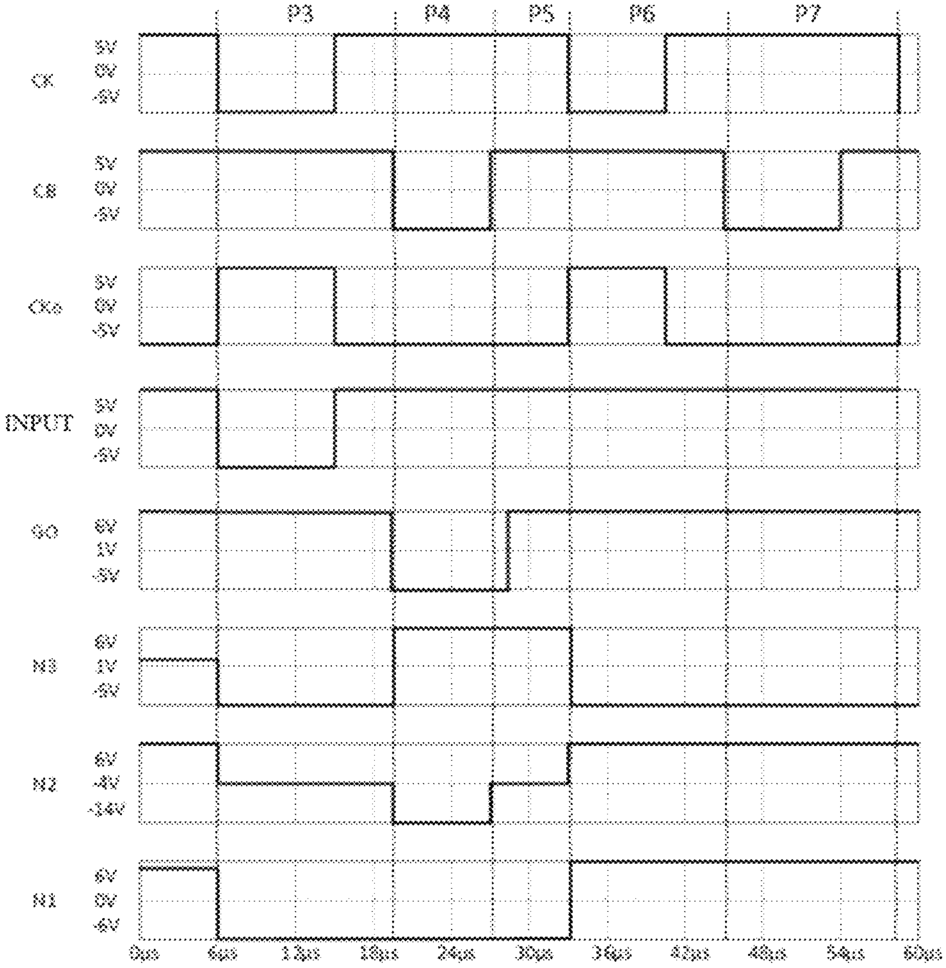
FIG. 20 is a schematic timing diagram of the shift register unit according to the second embodiment of the present disclosure.

FIG. 20 is a schematic timing diagram illustrating an operation process of the shift register unit according to the second embodiment of the present disclosure. As can be seen from the figure, the operation process from the first phase P1 to the fourth phase P4 is the same as that of the first embodiment, and is not repeated herein.

In the fifth phase P5, under the effect of the second capacitor, the potential at the second node is kept at a low potential, the sixth transistor is turned on, and the first clock signal is provided to the output terminal.

In the second embodiment, as shown in FIGS. 19 and 20, in the fifth phase P5, the first clock signal provided by the first clock signal terminal CB and the second clock signal provided by the second clock signal terminal CK are at a high voltage, and the clock signal provided by the fourth clock signal line CKo is at a low voltage. The third transistor T3 and the fourth transistor T4 are turned off, the first transistor T1 and the second transistor T2 are turned on, the high voltage signal provided by the first voltage terminal VGH is written into the third node N3, the fifth transistor is turned off, the potential at the third node N3 and the potential at the fourth node N4 are VH, and the potential at the first node and the potential at the second node are VL and (VL−Vth), respectively. The output terminal GO outputs the first clock signal provided by the first clock signal terminal CB. Vth is the threshold voltage of the sixth transistor T6.

In FIG. 20, the horizontal axis represents time, the third phase is denoted by reference symbol P3, the fourth phase is denoted by reference symbol P4, the fifth phase is denoted by reference symbol P5, the sixth phase is denoted by reference symbol P6, and the seventh phase is denoted by reference symbol P7. FIG. 20 shows a waveform of a clock signal provided by the second clock signal terminal CK, a waveform of a clock signal provided by the first clock signal terminal CB, a waveform of a clock signal provided by the fourth clock signal line CKo, a waveform of a signal provided by the input terminal INPUT, a waveform of a signal output from the output terminal GO, a waveform of a potential at the third node N3, a waveform of a potential at the second node N2, and a waveform of a potential at the first node N1.

Figure 21:
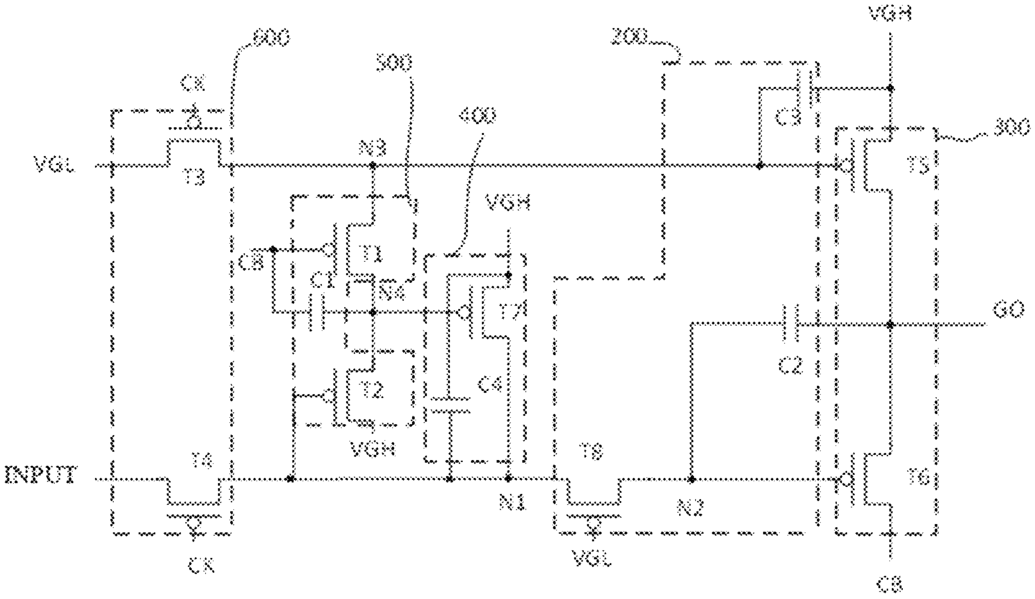
FIG. 21 is an equivalent schematic diagram of a shift register unit according to third embodiment of the present disclosure.

FIG. 21 is an equivalent schematic diagram of a shift register unit according to a third embodiment of the present disclosure;

In an embodiment, the control unit 400 may further include a fourth capacitor C4, a first terminal of the fourth capacitor C4 is electrically coupled to the first voltage terminal VGH, and a second terminal of the fourth capacitor C4 is electrically coupled to the first node N1. Compared with the first embodiment and the second embodiment, the fourth capacitor C4 is provided in the third embodiment, which can stabilize the potential at the first node N1, and further stabilize the second transistor T2. For example, in the third phase P3, the signal at the first node N1 is a low voltage signal provided by the input terminal INPUT. In the fourth phase P4, under the effect of the fourth capacitor C4, the potential at the first node N1 is kept at the low voltage, the second transistor T2 is turned on, a high voltage signal provided by the first voltage terminal VGH is written into the third node N3, so as to ensure that the fifth transistor T5 is turned off, and the first clock signal is provided to the output terminal GO.

Figure 22:
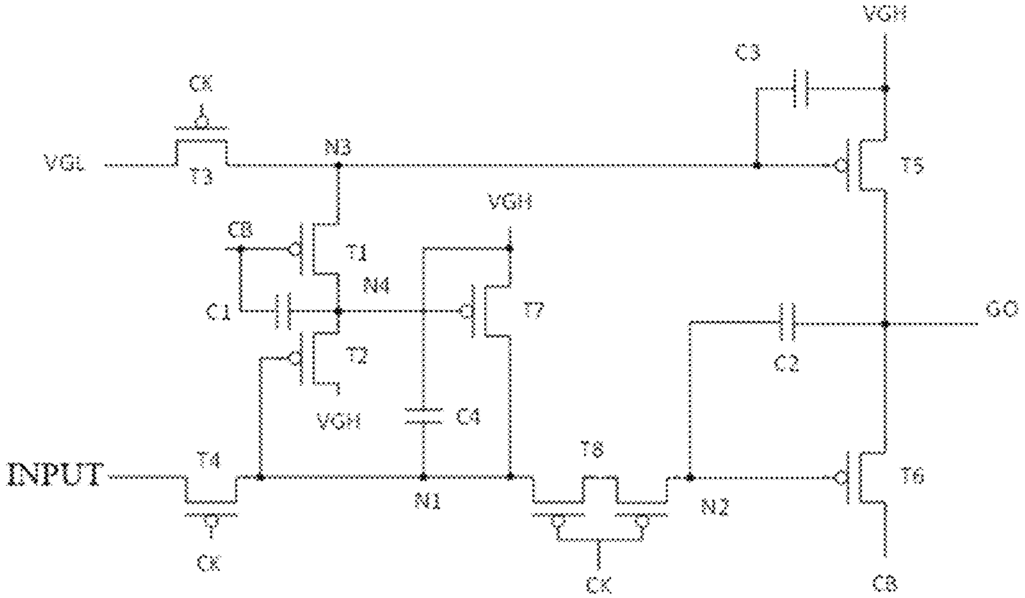
FIG. 22 is an equivalent schematic diagram of a shift register unit according to a fourth embodiment of the present disclosure.

FIG. 22 is an equivalent schematic diagram of a shift register unit according to a fourth embodiment of the present disclosure.

In an embodiment, unlike the third embodiment, the control electrode of the eighth transistor T8 in the voltage stabilizing sub-circuit 200 is electrically coupled to the second clock signal terminal CK. Further, the eighth transistor T8 may be a double-gate transistor. The operation process of the shift register unit according to the fourth embodiment of the present disclosure may be explained with reference to the timing diagram of the operation process of the shift register unit according to the first embodiment of the present disclosure.

In the first phase, the input signal is provided to the first node, the signal at the first node is transmitted to the second node through the eighth transistor, the sixth transistor is turned off, the fifth transistor is turned off, the second voltage signal is provided to the third node, and the output terminal outputs the first voltage signal. In the first phase P1, as shown in FIGS. 22 and 6, the second clock signal terminal CK is at a low voltage, the third transistor T3 and the fourth transistor T4 are turned on, the input signal is provided to the first node N1, the eighth transistor T8 is turned on, the signal at the first node N1 is transmitted to the second node N2 through the eighth transistor T8, both the potential at the first node N1 and the potential at the second node N2 are at a high voltage, the second transistor T2 and the sixth transistor T6 are turned off, the third transistor T3 is turned on to provide the second voltage signal to the third node N3, the potential at the third node N3 is at a low voltage, and the fifth transistor T5 is turned on to provide the first voltage signal to the output terminal.

In the second phase, the first voltage signal is provided to the first node, the signal at the first node is transmitted to the second node, the sixth transistor is turned off, the first transistor is turned on, and the output terminal keeps outputting the first voltage signal under the effect of the first capacitor and the third capacitor. In the fourth embodiment of the present disclosure, as shown in FIG. 22 and FIG. 8, in the second phase P2, the first clock signal provided by the first clock signal terminal CB is at a low voltage, the second clock signal provided by the second clock signal terminal CK is at a high voltage, and the input signal provided by the input terminal INPUT is at a high voltage. In the second phase P2, the second clock signal is at a high voltage, the third transistor T3 and the fourth transistor T4 are turned off, the eighth transistor T8 is turned off. When the potential at the first clock signal changes from the high voltage to the low voltage, the first transistor T1 is turned on, the potential at the third node N3 changes to $VL+(VL-VH)\times C1z/(C1z+C3z)$, and at this time, the potential at the fourth node N4 is substantially equal to that at the third node N3, and the potential at the third node N3 is $VL+(VL-VH)\times C1z/(C1z+C3z)$. Thereby, the seventh transistor T7 is turned on, so that the potential at the first node N1 is VH, the second transistor T2 is turned off, and the potential at the second node N2 is held at VH under the effect of the second capacitor C2. The sixth transistor T6 is turned off, and the potential output by the output terminal GO is the first voltage signal.

In the third phase, the input signal is provided to the first node, the signal at the first node is transmitted to the second node through the eighth transistor, the sixth transistor is turned on, the second voltage signal is provided to the third node, and the output terminal outputs the first voltage signal and the first clock signal.

In the fourth embodiment of the present disclosure, as shown in FIGS. 22 and 10, in the third phase P3, the first clock signal provided by the first clock signal terminal CB is at a high voltage, the second clock signal provided by the second clock signal terminal CK is at a low voltage, and the input signal provided by the input terminal INPUT is at a low voltage. In the third phase P3, the second clock signal provided by the second clock signal terminal CK is at a low voltage, the third transistor T3 and the fourth transistor T4 are turned on, the eighth transistor T8 is turned on, the input signal is provided to the first node N1, the signal at the first node N1 is transmitted to the second node N2 through the eighth transistor T8, the potential at the first node N1 and the potential at the second node N2 are both at a low voltage, the second transistor T2 and the sixth transistor T6 are turned on, and the high voltage signal provided by the first clock signal terminal CB is provided to the output terminal GO. The third transistor T3 is turned on, the second voltage signal provided by the second voltage terminal VGL is written into the third node N3, the potential at the third node N3 is a low voltage, and the fifth transistor T5 is turned on to provide the first voltage signal to the output terminal GO. At this time, the potential at the first node N1 and the potential at the second node N2 are about VL. The potential at the third node is VL, and the potential at the fourth node N4 is VH.

In the fourth phase, the first voltage signal is provided to the third node, the fifth transistor is turned off, the potential at the first node is kept at the low potential as in the previous phase, and the first clock signal is output to the output terminal through the sixth transistor. In the fourth embodiment, as shown in FIGS. 22 and 12, in the fourth phase P4, the first clock signal provided by the first clock signal terminal CB is at a low voltage, the second clock signal provided by the second clock signal terminal CK is at a high voltage, and the input signal provided by the input terminal INPUT is at a high voltage. The third transistor T3 and the fourth transistor T4 are turned off, the eighth transistor T8 is turned off, the potential at the first node N1 is maintained at VL by the fourth capacitor C4, the first transistor T1 and the second transistor T2 are turned on, the first voltage signal may be provided to the third node N3 through the first transistor T1 and the second transistor T2, the fifth transistor T5 is turned off, the sixth transistor T6 is turned on, and the output terminal GO outputs the low voltage signal provided by the first clock signal terminal CB.

The potential at the third node N3 is equal to the potential at the fourth node N4, and the potentials at the nodes N3 and N4 are both VH. Under the bootstrap effect of the capacitor, the potential at the second terminal of the second capacitor C2 jumps from VH as in the previous phase to VL with the variation amount of (VL−VH), and the potential at the first terminal of the second capacitor C2 is VL in the previous phase. In the fourth phase, the potential at the first terminal of the second capacitor C2, which is also the potential at the second node N2, is (2VL−VH−Vth), where Vth is the threshold voltage of the sixth transistor T6.

In the fifth phase, under the bootstrap effect of the second capacitor, the potential at the second node is kept at a low potential, the sixth transistor is turned on, and the first clock signal is provided to the output terminal. In the fourth embodiment of the present disclosure, as shown in FIGS. 20 and 12, in the fifth phase P5, the first clock signal provided by the first clock signal terminal CB, the second clock signal provided by the second clock signal terminal CK, and the clock signal provided by the input terminal INPUT are all at a high voltage. The third transistor T3, the fourth transistor T4, the first transistor T1, and the eighth transistor T8 are all turned off, the potential at the first node N1 is held at VL by the fourth capacitor C4, the potential at the third node N3 is equal to the potential at the fourth node N4, and the potential at the third node N3 and the potential at the fourth node N4 are all VH. The seventh transistor T7 and the fifth transistor T5 are turned off, the sixth transistor T6 is turned on, and the output terminal GO outputs the high voltage signal provided by the first clock signal terminal CB. The potential at the second terminal of the second capacitor C2 jumps from VL as in the previous phase to VH with a variation amount of (VH−VL), the potential at the first terminal of the second capacitor C2 is (2VL−VH−Vth) in the previous phase, and in the fifth phase, the potential at the first terminal of the second capacitor C2 is (VL−Vth), which is also the potential at the second node N2.

In the sixth phase, the signal of the input terminal is provided to the first node, the sixth transistor is turned off, the second voltage signal is provided to the third node, and the fifth transistor is turned on to provide the first voltage signal to the output terminal. In the fourth embodiment of the present disclosure, as shown in FIGS. 22 and 16, in the sixth phase P6, the first clock signal provided by the first clock signal terminal CB is at a high voltage, the second clock signal provided by the second clock signal terminal CK is at a low voltage, and the input signal provided by the input terminal INPUT is at a high voltage. In the sixth phase P6, the second clock signal provided by the second clock signal terminal CK is at a low voltage, the third transistor T3 and the fourth transistor T4 are turned on, the input signal is provided to the first node N1, the eighth transistor T8 is turned on, the signal at the first node N1 is transmitted to the second node N2 through the eighth transistor T8, both the first node N1 and the second node N2 are at a high voltage, the second transistor T2 and the sixth transistor T6 are turned off, the second voltage signal is provided to the third node N3, the potential at the third node N3 is a low voltage, the fifth transistor T5 is turned on, and the first voltage signal is provided to the output terminal. At this time, the potential at the first node N1 and the potential at the second node N2 are about VH. The potential at the third node is VL, and the potential at the fourth node N4 is VH.

In the seventh phase, the first voltage signal is provided to the first node, the sixth transistor is turned off, the potential at the third node maintains at the low potential as in the previous phase, the fifth transistor is turned on, and the first voltage signal is provided to the output terminal. In the fourth embodiment of the present disclosure, as shown in FIG. 22 and FIG. 18, in the seventh phase P7, the first clock signal provided by the first clock signal terminal CB is at a low voltage, the second clock signal provided by the second clock signal terminal CK is at a high voltage, and the input signal provided by the input terminal INPUT is at a high voltage. In the seventh phase P7, the second clock signal is at a high voltage, and the third transistor T3, the fourth transistor T4, the eighth transistor T8 and the sixth transistor T6 are turned off. The first clock signal is at a low voltage, the first transistor T1 is turned on, the potentials at the third node N3 and the fourth node N4 are about VL, the seventh transistor T7 is turned on, the potential at the first node N1 is VH, and the potential at the second node N2 maintains at VH under the effect of the second capacitor C2. The potential at the first node N1 and the potential at the second node N2 are VH, the second transistor T2 and the sixth transistor T6 are turned off, the first clock signal provided by the first clock signal terminal CB cannot be provided to the output terminal GO, the fifth transistor T5 is turned on, and therefore the output terminal GO outputs the first voltage signal at this time.

The operations in the eighth phase are the same as those in the sixth phase, and are not described herein.

It can be seen that, in the case where the control electrode of the eighth transistor T8 is coupled to the second clock signal terminal CK, the function of the fourth capacitor C4 is important, and the fourth capacitor C4 can play a role of holding the potential at the first node N1 when the eighth transistor T8 is turned on or off, thereby stabilizing the operating state of the second transistor T2.

The double-gate structure has a voltage division effect, and the eighth transistor T8 has a double-gate structure, so that the potential at the second node N2 can be reduced, to reach −15 to −20V. The decrease in amount of potential reduction of the second node N2 can weaken the DIBL effect (the DIBL effect is a drain induced barrier reduction effect) generated by the eighth transistor T8, which reduces the leakage current when the eighth transistor T8 is turned off, and is beneficial to reducing the interference of the leakage current of the eighth transistor T8 with the sixth transistor T6 when being turned on, so that the eighth transistor T8 works more stably, and the risk of phenomena such as negative drift and bus pull is reduced.

Figure 23:
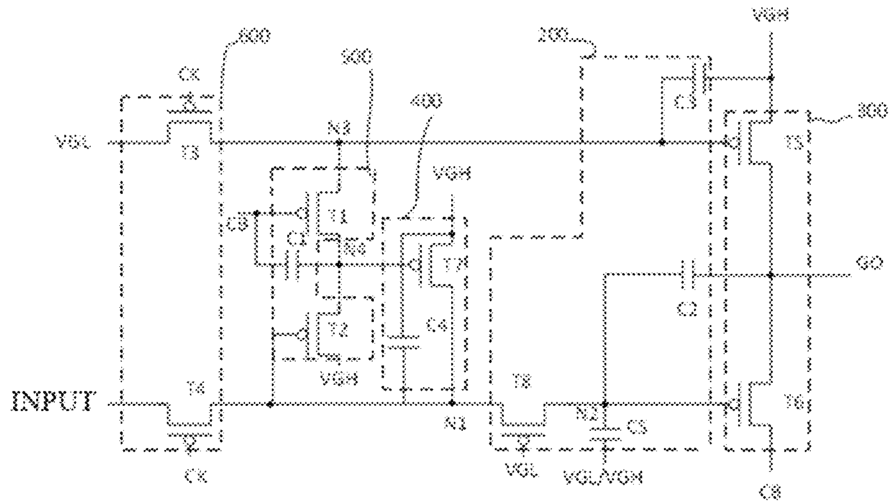
FIG. 23 is an equivalent schematic diagram of a shift register unit according to a fifth embodiment of the present disclosure.

FIG. 23 is an equivalent schematic diagram of a shift register unit according to a fifth embodiment of the present disclosure.

In an embodiment, the voltage stabilizing sub-circuit 200 may further include a fifth capacitor C5, a first terminal of the fifth capacitor C5 is electrically coupled to a DC voltage terminal, which may be, for example, the first voltage terminal VGH or the second voltage terminal VGL, and a second terminal of the capacitor C5 is electrically coupled to the second node N2. By adopting a structure that the second capacitor C2 and the fifth capacitor C5 are coupled in series, when the potential of a signal output by the output terminal GO jumps, due to the voltage division effect of the second capacitor C2 and the fifth capacitor C5, the potential jumped at the second node N2 may be reduced. For example, the jumped potential may be changed from (−15~−20V) to (−10~−15V) or higher, the threshold voltage drift of the eighth transistor T8 due to the DIBL effect can also be reduced, and the stability of the eighth transistor T8 can be further improved.

It should be noted that the eighth transistor in the fourth and fifth embodiments of the present disclosure is not a normally-open transistor compared to the first, second and third embodiments of the present disclosure, and in the first, second and third embodiments of the present disclosure, the control electrode of the eighth transistor T8 is coupled to the second voltage terminal VGL, and the eighth transistor T8 is a normally-open transistor. When the connection is not required, the eighth transistor T8 is turned off, and the influence of the second node N2 on the potential at the first node N1 can be reduced, so as to improve the stability of the circuit.

Figure 24:
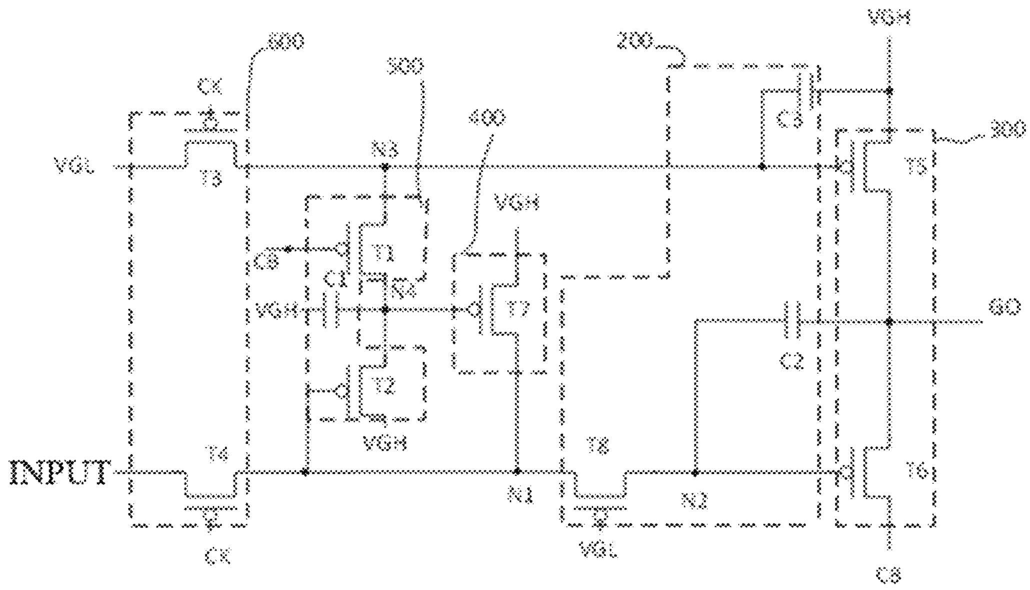
FIG. 24 is an equivalent schematic diagram of a shift register unit according to a sixth embodiment of the present disclosure.

FIG. 24 is an equivalent schematic diagram of a shift register unit according to a sixth embodiment of the present disclosure.

The difference between the shift register unit described in the sixth embodiment of the present disclosure and the shift register unit described in the first embodiment of the present disclosure is as follows: the first terminal of the first capacitor C1 is electrically coupled to the first voltage terminal VGH.

In a specific implementation, the first terminal of the first capacitor C1 may also be electrically coupled to a DC voltage terminal such as the first voltage terminal VGH or the second voltage terminal VGL, which can also stabilize the potential at the fourth node N4.

The operation timing diagram of the shift register unit according to the sixth embodiment of the present disclosure is the same as the operation timing diagram of the shift register unit according to the first embodiment of the present disclosure.

Figure 25:
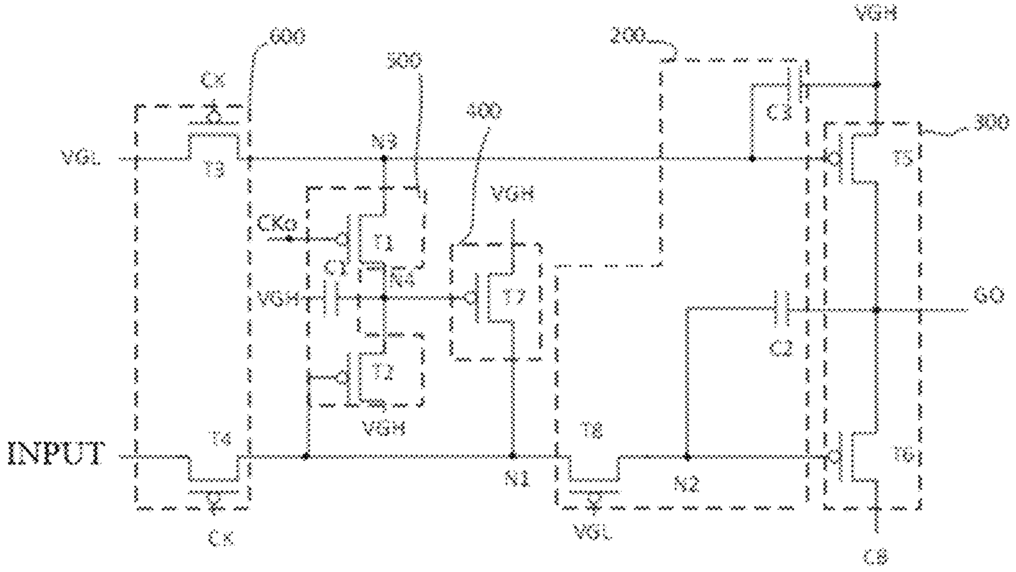
FIG. 25 is an equivalent schematic diagram of a shift register unit according to a seventh embodiment of the present disclosure.

FIG. 25 is an equivalent schematic diagram of a shift register unit according to a seventh embodiment of the present disclosure.

The difference between the shift register unit described in the seventh embodiment of the present disclosure and the shift register unit described in the sixth embodiment of the present disclosure is as follows: the gate electrode of the first transistor T1 is electrically coupled to the fourth clock signal line CKo.

Figure 26:
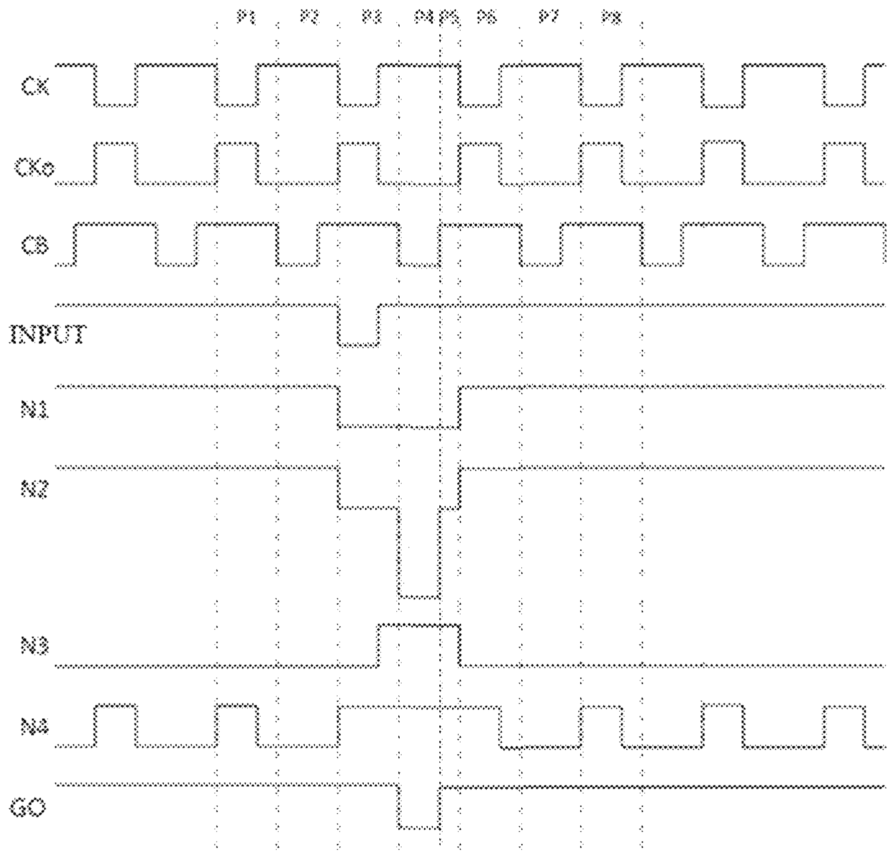
FIG. 26 is a schematic timing diagram illustrating an operation of a shift register unit according to a seventh embodiment of the present disclosure

A schematic timing diagram illustrating operation of the shift register unit as shown in FIG. 25 according to the seventh embodiment of the present disclosure is as shown in FIG. 26.

FIG. 26 differs from FIG. 6 only in that: in the third phase P3, when the fourth clock signal line CKo provides a low voltage, the potential at the third node N3 is pulled high.

In the sixth phase P6, when the fourth clock signal line CKo provides a low voltage, the potential of the fourth node N4 is pulled low.

FIG. 26 shows a waveform of a clock signal provided by the second clock signal terminal CK, a waveform of a clock signal provided by the fourth clock signal line CKo, a waveform of a clock signal provided by the first clock signal terminal CB, a waveform of a signal provided by the input terminal INPUT, a waveform of a potential at the first node N1, a waveform of a potential at the second node N2, a waveform of a potential at the third node N3, a waveform of a potential at the node N4, and a waveform of a signal output from the output terminal GO.

Figure 27:
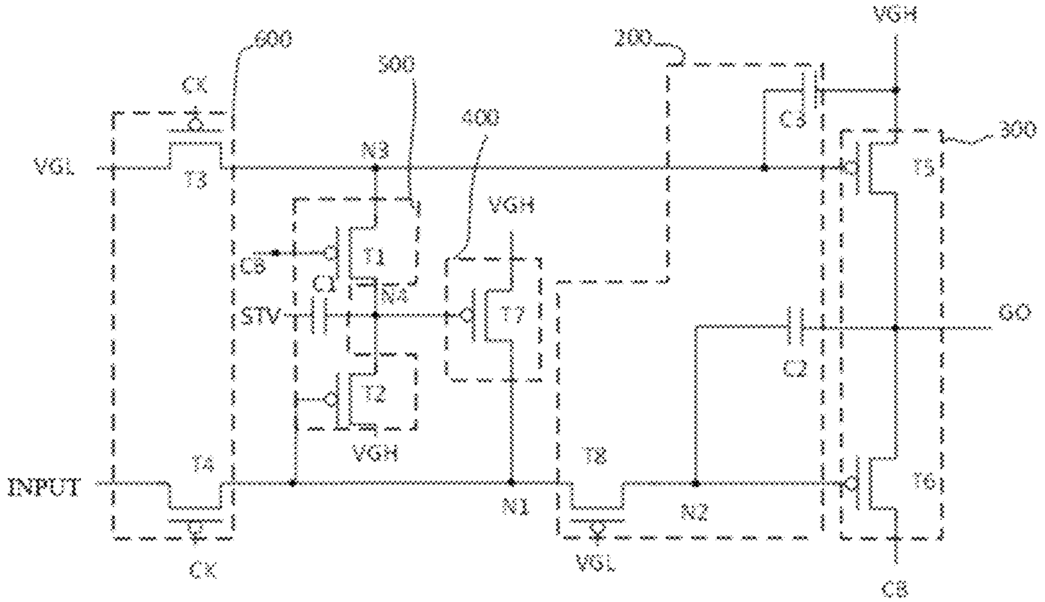
FIG. 27 is an equivalent schematic diagram of a shift register unit according to an eighth embodiment of the present disclosure.

FIG. 27 is an equivalent schematic diagram of a shift register unit according to an eighth embodiment of the present disclosure.

The difference between the shift register unit described in the eighth embodiment of the present disclosure and the shift register unit described in the first embodiment of the present disclosure is as follows: the first terminal of the first capacitor C1 is electrically coupled to the input terminal INPUT.

In a specific implementation, the first terminal of the first capacitor C1 may also be electrically coupled to the input terminal INPUT, which can also stabilize the potential at the fourth node N4.

The operation timing diagram of the shift register unit according to the eighth embodiment of the present disclosure shown in FIG. 27 is the same as the operation timing diagram of the shift register unit according to the first embodiment of the present disclosure.

Figure 28:
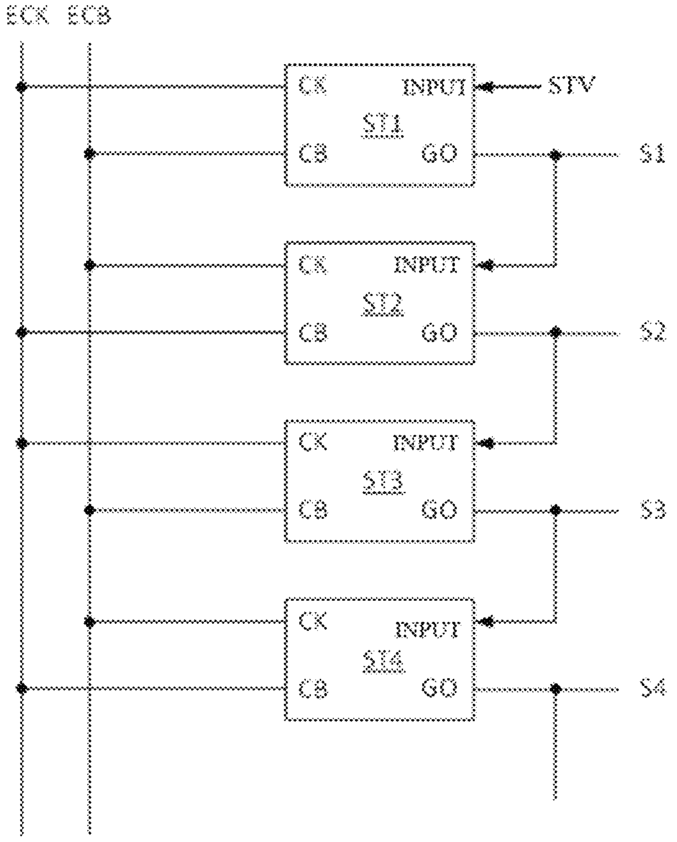
FIG. 28 is a schematic diagram of a driving circuit according to an embodiment of the present disclosure.

FIG. 28 is a schematic diagram of a driving circuit according to an embodiment of the present disclosure.

Referring to FIG. 28, the driving circuit according to the embodiment of the present disclosure is applicable to the shift register units described in the first, third, fourth, fifth, sixth, seventh and eighth embodiments of the present disclosure. For convenience of description, four stages of shift register units are shown, and the driving circuit includes a first-stage shift register unit ST1, a second-stage shift register unit ST2, a third-stage shift register unit ST3 and a fourth-stage shift register unit ST4. The first-stage shift register unit ST1 is electrically coupled to a first scan line S1, the second-stage shift register unit ST2 is electrically coupled to a second scan line S2, the third-stage shift register unit ST3 is electrically coupled to a third scan line S3, and the fourth-stage shift register unit ST4 is electrically coupled to a fourth scan line S4. First voltage terminals and second voltage terminals of all the shift register units are coupled to a first power line and a second power line, respectively, and are driven in accordance with a clock signal provided by a first clock signal line ECB and a clock signal provided by a second clock signal line ECK. The first-stage shift register unit ST1, the second-stage shift register unit ST2, the third-stage shift register unit ST3 and the fourth-stage shift register unit ST4 may have the same circuit layout. Each stage of the shift register units ST1, ST2, ST3 to ST4 includes an input terminal and an output terminal. The input terminal of each stage of shift register unit receives an output signal (i.e., a scan signal) outputted by a previous stage of shift register unit or a start signal. For example, the input terminal of the first-stage shift register unit ST1 is electrically coupled to a start signal terminal STV, and the input terminal of each of the other stages of shift register units receives the output signal outputted by the previous stage of shift register unit.

The first clock signal terminal CB of an ith-stage shift register unit STi (i is an odd number) is electrically coupled to the first clock signal line ECB, and the second clock signal terminal CK of the ith-stage shift register unit STi is electrically coupled to the second clock signal line ECK. The first clock signal terminal CB of a (i+1)th-stage shift register unit STi+1 is electrically coupled to the second clock signal line ECK, and the second clock signal terminal CK of the (i+1)th-stage shift register unit STi+1 is electrically coupled to the first clock signal line ECB.

The clock signal provided by the first clock signal line ECB and the clock signal provided by the second clock signal line ECK have the same period and have non-overlapping phases. Specifically, although the time during which the first clock signal line ECB does not provide the clock signal and the time during which the second clock signal line ECK does not provide the clock signal may overlap (for example, the clock signal provided by the first clock signal line ECB and the clock signal provided by the second clock signal line ECK may be at a high voltage at the same time), the time during which the first clock signal line ECB provides the clock signal and the time during which the second clock signal line ECK provides the clock signal (for example, the time during which the first clock signal ECB and the second clock signal ECK are at a low voltage) do not overlap.

Figure 29:
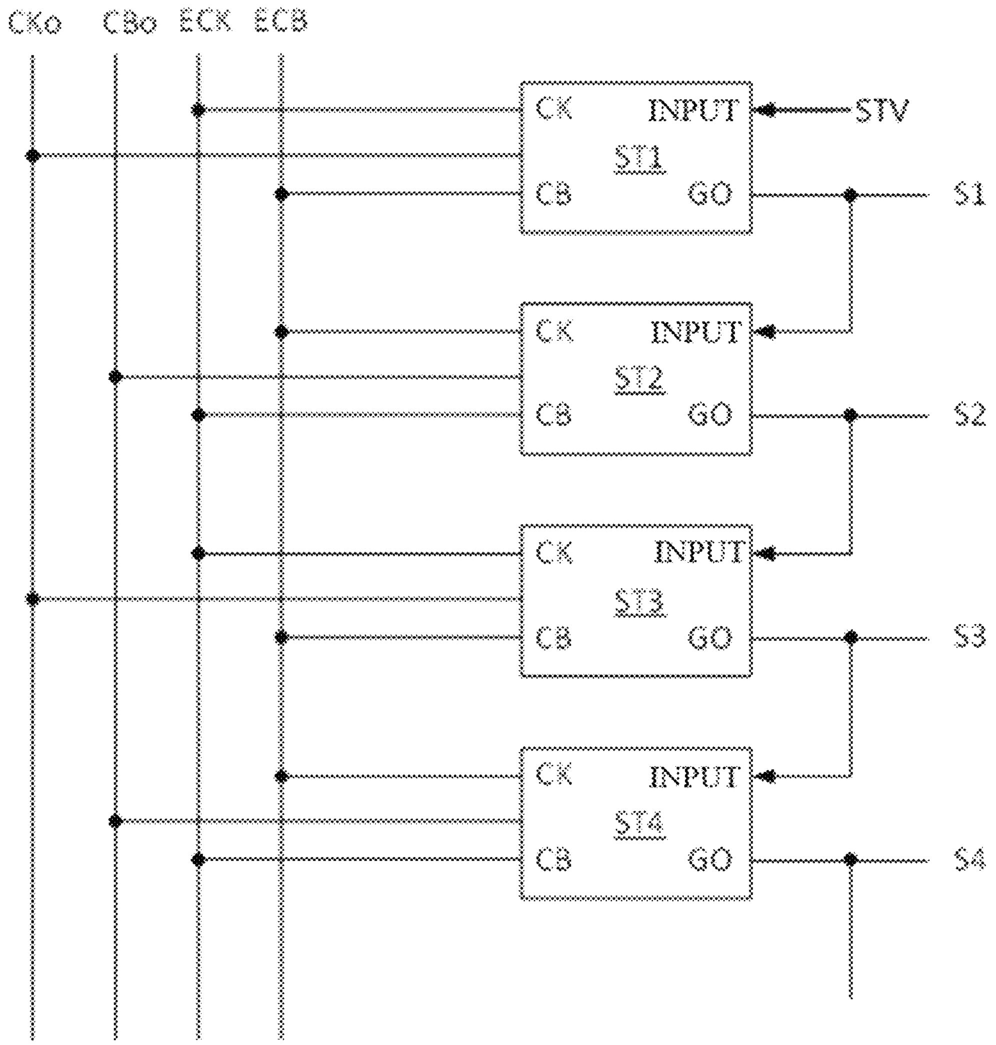
FIG. 29 is a schematic diagram of a driving circuit according to another embodiment of the present disclosure.

FIG. 29 is a schematic diagram of a driving circuit according to another embodiment of the present disclosure.

In FIG. 29, reference symbol STV represents a start signal terminal.

The driving circuit shown in FIG. 29 is suitable for the shift register unit described in the second embodiment of the present disclosure, and compared with the driving circuit described in the embodiment shown in FIG. 28, the same features are not repeated. The embodiment of the driving circuit shown in FIG. 29 is different from the embodiment of the driving circuit shown in FIG. 28 in that the ith-stage (i is an odd number) shift register unit STi is further electrically coupled to the fourth clock signal line CKo, and the (i+1)th-stage shift register unit STi+1 is further electrically coupled to the third clock signal line CBo. The clock signal provided by the third clock line CBo is inverted with respect to the first clock signal, and the clock signal provided by the fourth clock line CKo is inverted with respect to the second clock signal.

In an embodiment of the present invention, a difference between the phase of the clock signal provided by the first clock signal line and the phase of the clock signal provided by the second clock signal line may be 90 degrees, but is not limited thereto.

In the present application, the case that the phase of a clock signal is inverted with respect to the phase of another clock signal means that when one of the potentials of the two clock signals is a high potential, the other one is a low potential with no strict limitation, and a short time of non-inversion is allowed, as long as a person skilled in the art can implement the technical solution of the present application.

Figure 30:
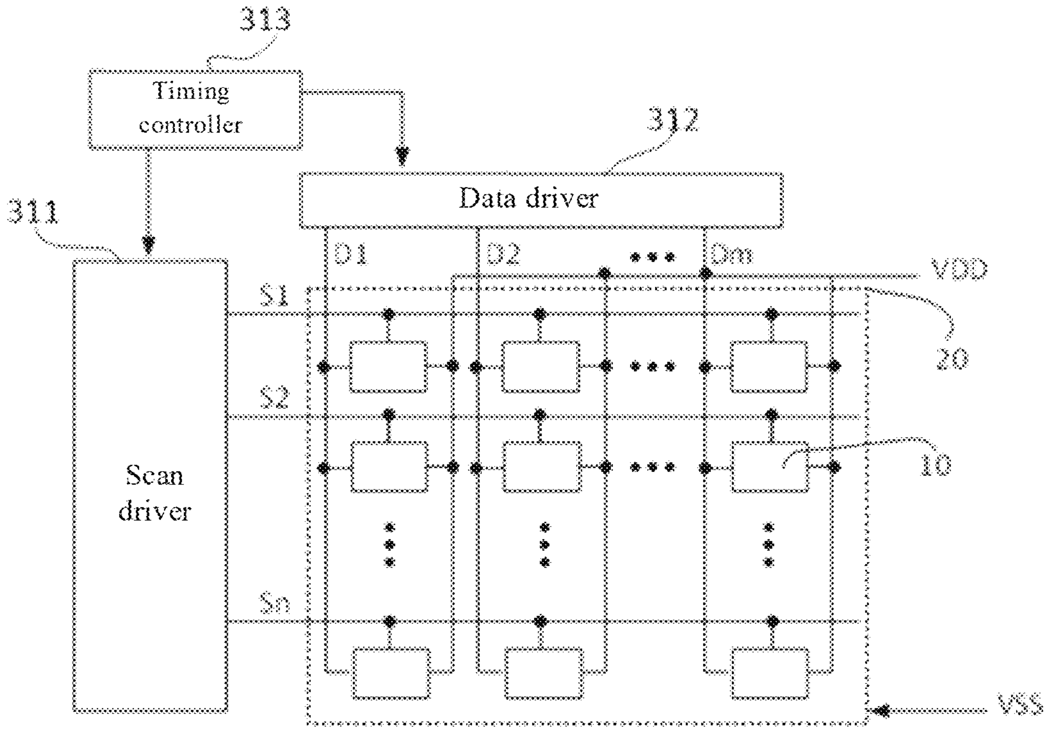
FIG. 30 is a schematic diagram of a display device according to an embodiment of the present disclosure.

FIG. 30 is a schematic diagram of a display device according to an embodiment of the present disclosure.

Referring to FIG. 30, the display device may include a scan driver 311 (which may include the driving circuit described above), a data driver 312, a timing controller 313, and a pixel unit 20 having pixels 10 disposed at intersections of first to nth scan lines S1 to Sn and first to mth data lines D1 to Dm. The scan driver 311 is configured to drive the first to nth scan lines S1 to Sn, the data driver 312 is configured to drive the first to mth data lines D1 to Dm, and the timing controller 313 is configured to control the scan driver 311 and the data driver 312. The scan driver 311 provides scan signals to the first to nth scan lines S1 to Sn, respectively. For example, the scan driver 311 may sequentially provide the scan signals to the first to nth scan lines S1 to Sn. In this case, the pixels 10 are selected in units of horizontal lines. For this purpose, the scan driver 311 includes shift register units coupled to the first to nth scan lines S1 to Sn, respectively.

In FIG. 30, reference symbol S2 denotes a second scan line, and reference symbol D2 denotes a second data line.

The data driver provides the data signals to the data lines D1 to Dm in synchronization with the scan signals. Then, a voltage corresponding to the data signal is charged into the pixel selected by the scan signal. The timing controller controls the scan driver and the data driver. In addition, the timing controller transmits data (not shown) outside to the data driver. When the scan signal is provided to write in a voltage corresponding to the data signal and a current corresponding to the voltage is provided to the organic light emitting diode (not shown), the pixel is selected to generate a light component having a predetermined luminance component.

In embodiments of the present disclosure, n and m may both be integers greater than 1.

In FIG. 30, reference symbol VDD denotes a high voltage, and reference symbol VSS denotes a low voltage.

In the embodiments of the present disclosure, the display device may be an organic light emitting display, but is not limited thereto.

Based on the inventive concept of the foregoing embodiments, an embodiment of the present disclosure also provides a display device including the driving circuit according to the foregoing embodiments. The display device may be: any product or component with a display function, such as a mobile phone, a tablet computer, a television, a display, a notebook computer, a digital photo frame, a navigator and the like.

Although the embodiments disclosed in the present disclosure are described above, the descriptions are only for the purpose of understanding the present disclosure, and are not used to limit the present disclosure. It will be understood by those skilled in the art of the present disclosure that various changes in form and details may be made thereto without departing from the spirit and scope of the present disclosure, and that the scope of the present disclosure is to be limited only by the scope of the following claims.

What is claimed is:

1. A shift register unit, comprising a first input circuit, a second input circuit, a control circuit and an output circuit, wherein the first input circuit is respectively coupled to an input terminal, a second voltage terminal, a second clock signal terminal, a first node and a third node, and is configured to provide an input signal to the first node and provide a second voltage signal to the third node in response to a second clock signal provided by the second clock signal terminal; the input terminal is configured to provide the input signal, and the second voltage terminal is configured to provide the second voltage signal;

the second input circuit is respectively coupled to the third node, a fourth node and a first voltage terminal, and is configured to output a signal to the third node; the second input circuit comprises a first transistor and a first capacitor, the first capacitor is directly coupled to the first transistor;

the control circuit is respectively coupled to the first node and the first voltage terminal and is configured to provide a first voltage signal to the first node; the first voltage terminal is configured to provide the first voltage signal; and the output circuit is electrically coupled to the third node, the first node, the first voltage terminal and an output terminal, respectively, and is configured to control a signal output by the output terminal, wherein a first terminal of the first capacitor is electrically coupled to the first voltage terminal, and a second terminal of the first capacitor is electrically coupled to the fourth node.

2. The shift register unit of claim 1, wherein the control circuit comprises a seventh transistor; and a first electrode of the seventh transistor is electrically coupled to the first voltage terminal, and a second electrode of the seventh transistor is electrically coupled to the first node.

3. The shift register unit of claim 1, wherein a control electrode of the first transistor is electrically coupled to a first clock signal terminal, a first electrode of the first transistor is electrically coupled the fourth node, and a second electrode of the first transistor is electrically coupled to the third node.

4. The shift register unit of claim 3, wherein the second input circuit further comprises a second transistor;

a control electrode of the second transistor is electrically coupled to the first node, a second electrode of the second transistor is electrically coupled to the fourth node, and a first electrode of the second transistor is electrically coupled to the first voltage terminal.

5. The shift register unit of claim 1, wherein the first input circuit comprises a third transistor and a fourth transistor, a control electrode of the third transistor is electrically coupled to the second clock signal terminal, a first electrode of the third transistor is electrically coupled to the second voltage terminal, and a second electrode of the third transistor is electrically coupled to the third node; and a control electrode of the fourth transistor is electrically coupled to the second clock signal terminal, a second electrode of the fourth transistor is electrically coupled to the first node, and a first electrode of the fourth transistor is electrically coupled to the input terminal.

6. The shift register unit of claim 1, wherein the output circuit comprises a voltage stabilizing sub-circuit and an output sub-circuit, the voltage stabilizing sub-circuit is electrically coupled to the third node, the output terminal, the first node, the second node and a control voltage terminal, respectively, and is configured to maintain the potential at the third node, control connection or disconnection between the first node and the second node in response to a control voltage signal provided by the control voltage terminal, and control a potential at the second node according to the signal output by the output terminal, and the output sub-circuit is electrically coupled to the third node, the second node, the first voltage terminal, the first clock signal terminal and the output terminal, respectively, and is configured to control provision of the first voltage signal to the output terminal under control of the potential at the third node, and control provision of the first clock signal to the output terminal under control of the potential at the second node.

7. The shift register unit of claim 6, wherein the voltage stabilizing sub-circuit comprises an eighth transistor, a second capacitor, and a third capacitor, a control electrode of the eighth transistor is electrically coupled to the control voltage terminal, a first electrode of the eighth transistor is electrically coupled to the first node, and a second electrode of the eighth transistor is electrically coupled to the second node, a first terminal of the second capacitor is coupled to the second node, and a second terminal of the second capacitor is coupled to the output terminal, a first terminal of the third capacitor is coupled to the third node, and a second terminal of the third capacitor is coupled to the first voltage terminal, the output sub-circuit comprises a fifth transistor and a sixth transistor, a control electrode of the fifth transistor is electrically coupled to the third node, a first electrode of the fifth transistor is electrically coupled to the first voltage terminal, and a second electrode of the fifth transistor is electrically coupled to the output terminal, a control electrode of the sixth transistor is electrically coupled to the second node, a first electrode of the sixth transistor is electrically coupled to the first clock signal terminal, and a second electrode of the sixth transistor is electrically coupled to the output terminal, and the control voltage terminal is the second voltage terminal or the second clock signal terminal.

8. A driving circuit, comprising a plurality of shift register units coupled in cascade, the shift register unit being the shift register unit according to claim 1, wherein an input terminal of a first-stage shift register unit is coupled to a start signal terminal, an input terminal of a (i+1)th-stage shift register unit is coupled to an output terminal of an ith-stage shift register unit, an odd-numbered stage of shift register unit has a first clock signal terminal coupled to a first clock signal line and a second clock signal terminal coupled to a second clock signal line, and an even-numbered stage of shift register unit has a first clock signal terminal coupled to the second clock signal line and a second clock signal terminal coupled to the first clock signal line, where i+1 is a positive integer greater than or equal to 2.

9. The driving circuit of claim 8, wherein a third clock signal terminal of the odd-numbered stage of shift register unit is coupled to a fourth clock signal line, and a third clock signal terminal of the even-numbered stage of shift register unit is coupled to a third clock signal line; and each of a clock signal provided by the third clock signal line and a clock signal provided by the first clock signal line is a square wave signal with repetitive high voltage and low voltage, and a high voltage period is longer than a low voltage period in each cycle of each of the clock signal provided by the third clock signal line and the clock signal provided by the first clock signal line; each of a clock signal provided by the fourth clock signal line and a clock signal provided by the second clock signal line is a square wave signal with repetitive high voltage and low voltage, and a high voltage period is longer than a low voltage period in each cycle of each of the clock signal provided by the fourth clock signal line and the clock signal provided by the second clock signal line.

10. A display device, comprising a driving circuit, wherein the driving circuit is the driving circuit of claim 8.

* * * * *